(12) United States Patent
Miura et al.

(10) Patent No.: US 10,892,158 B2
(45) Date of Patent: Jan. 12, 2021

(54) MANUFACTURING METHOD OF A SEMICONDUCTOR DEVICE AND A PLASMA PROCESSING APPARATUS

(71) Applicant: HITACHI HIGH-TECH CORPORATION, Tokyo (JP)

(72) Inventors: Makoto Miura, Tokyo (JP); Yohei Ishii, Hillsboro, OR (US); Satoshi Sakai, Tokyo (JP); Kenji Maeda, Hillsboro, OR (US)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/371,502

(22) Filed: Apr. 1, 2019

(65) Prior Publication Data

US 2020/0312658 A1    Oct. 1, 2020

(51) Int. Cl.
*H01L 21/02* (2006.01)
*H01L 29/165* (2006.01)
(Continued)

(52) U.S. Cl.
CPC .. *H01L 21/02532* (2013.01); *H01L 21/02381* (2013.01); *H01L 21/0337* (2013.01);
(Continued)

(58) Field of Classification Search
None
See application file for complete search history.

(56) References Cited

U.S. PATENT DOCUMENTS

2014/0054265 A1  2/2014  Fujikawa et al.
2015/0099368 A1  4/2015  Shen et al.
(Continued)

FOREIGN PATENT DOCUMENTS

JP   H10256158 A   9/1998
JP   2004103578 A  4/2004
(Continued)

OTHER PUBLICATIONS

"Hitachi High-Technologies Develops Enhanced Microwave ECR Etching Module", News Release, Mar. 22, 2018. (Year: 2018).*
(Continued)

*Primary Examiner* — J. E. Schoenholtz
(74) *Attorney, Agent, or Firm* — Miles & Stockbridge, P.C.

(57) ABSTRACT

A manufacturing process of a semiconductor device including a SiGe channel can form a Si segregation layer for protecting the SiGe channel without damaging the SiGe channel. A manufacturing method of a semiconductor device includes: a first step for performing plasma processing on a semiconductor substrate having a silicon layer and a silicon germanium layer formed on the silicon layer under a first condition to expose the silicon germanium layer; and a second step for performing plasma processing on the semiconductor substrate under a second condition to segregate silicon on the surface of the exposed silicon germanium layer. The silicon germanium layer or layers lying adjacent to the silicon germanium layer can be etched under the first condition, hydrogen plasma processing is performed under the second condition, and the first step and the second step are executed in series in the same processing chamber of a plasma processing apparatus.

12 Claims, 40 Drawing Sheets

(51) Int. Cl.
  *H01L 29/66* (2006.01)
  *H01L 29/78* (2006.01)
  *H01L 29/10* (2006.01)
  *H01L 21/8238* (2006.01)
  *H01L 21/67* (2006.01)
  *H01L 21/3065* (2006.01)
  *H01L 21/033* (2006.01)
  *H01L 27/092* (2006.01)

(52) U.S. Cl.
  CPC .... *H01L 21/3065* (2013.01); *H01L 21/67069* (2013.01); *H01L 21/823807* (2013.01); *H01L 21/823821* (2013.01); *H01L 21/823878* (2013.01); *H01L 27/0924* (2013.01); *H01L 29/1054* (2013.01); *H01L 29/165* (2013.01); *H01L 29/66545* (2013.01); *H01L 29/66795* (2013.01); *H01L 29/785* (2013.01)

(56) References Cited

U.S. PATENT DOCUMENTS

| | | |
|---|---|---|
| 2016/0190286 A1 | 6/2016 | Wang et al. |
| 2016/0307765 A1 | 10/2016 | Shen et al. |
| 2018/0026100 A1 | 1/2018 | Jagannathan et al. |
| 2018/0138018 A1* | 5/2018 | Voronin ............ H01J 37/32082 |

FOREIGN PATENT DOCUMENTS

| | | |
|---|---|---|
| JP | 2013225604 A | 10/2013 |
| JP | 2014011245 A | 1/2014 |
| JP | 2015076459 A | 4/2015 |
| JP | 2017103298 A | 6/2017 |

OTHER PUBLICATIONS

Ishii, Yohei, et al. "Anisotropic Selective Etching between SiGe and Si." Japanese Journal of Applied Physics, vol. 57, No. 6S2, 2018, doi:10.7567/jjap.57.06jc04. (Year: 2018).*

G. Tsutsui et al.; "Leakage aware Si/SiGe CMOS FinFET for Low Power Applications"; Proceedings of VLSI Symposium 2018; IEEE 2018; pp. 87-88.

P. Hashemi et al.; "High-Performance and Reliable Strained SiGe PMOS FinFETs Enabled by Advanced Gate Stack Engineering"; Proceedings of IEDM 2017; IEEE 2017; pp. 824-827.

E. Rudkevich et al.; "Hydrogen Induced Si Surface Segregation on Ge-Covered Si (001)"; Physical Review Letters vol. 81; The American Physical Society; 1998; pp. 3467-3470.

Office Action dated Nov. 17, 2020 in corresponding Japanese Application No. 2019-229014.

* cited by examiner

MANUFACTURING METHOD OF A SEMICONDUCTOR DEVICE AND A PLASMA PROCESSING APPARATUS

TECHNICAL FIELD

The present invention relates to a manufacturing method of a semiconductor device and a plasma processing apparatus.

BACKGROUND ART

In order to ceaselessly improve the functions and capabilities of integrated circuit chips, miniaturization of transistors is indispensable. In order to realize the miniaturization of transistors, not only the reduction of processing dimensions is examined but also the structures and materials of devices are examined from various angles for improving the capabilities of miniaturized transistors. For example, the introduction of strains into the source/drain regions of a metal oxide semiconductor field effect transistor (MOSFET), the introduction of high dielectric gate insulating films and metals, the introduction of new structures such as fin type transistors instead of planar type transistors, and the like can be cited.

The controllability of the gate of a fin type FET is improved by covering the periphery of the fin type channel having a three-dimensional structure by the gate, so that a short-channel effect (that increases a leakage current) owing to the reduction of the gate length of a transistor brought about by the miniaturization of the transistor can be suppressed. When the miniaturization further progresses, it is expected that an FET becomes a gate all around type FET (GAA type FET) the channel of which is composed of a wire-type or a sheet-type laminated body and the periphery of which is covered with the gate of the FET. It is believed that such a change of the channel structure takes place with the change of the material of the channel. This is because an on-current in a low electric field region is deteriorated since an on-current/off-current ratio is decreased in accordance with the scaling of the power supply voltage (drain voltage) of a transistor and the decrease of the on-current in accordance with increase in parasitic resistances such as a contact resistance owing to the miniaturization. Therefore, for example, Groups III-V compounds such as Indium Gallium Arsenide (InGaAs) the carrier mobility of which is higher than silicon (Si) and Group IV semiconductor materials such as germanium (Ge) the carrier mobility of which is also higher than silicon are expected to be introduced. In particular, since silicon germanium (SiGe) has a characteristic that its hole mobility is higher than that of Si as well as SiGe easily lattice-matches with Si, a strain can be introduced into a SiGe channel, so that the mobility of the transistor can be expected to improve greatly. Therefore, it is expected that SiGe is introduced as a material for the p type channel of a fin type FET or a GAA type FET.

However, a SiGe channel has a problem that the characteristic of an interface between the SiGe channel and a gate insulating film is poor. Since a dangling bond of a Ge atom on the surface of SiGe is not easily terminated by a hydrogen atom, there are many dangling bonds on the surface of SiGe, and they become main traps for carriers. The traps cause leakage currents, and at the same time the traps induce carrier scattering, which reduces the mobilities of carriers. Therefore, a technique that improves the characteristic of the interface between the SiGe channel and the gate insulating film has been proposed.

Patent Literature 1 and Non-patent Literature 1 disclose a technology in which a Si passivation film is made on a SiGe channel by using an epitaxial growth method (a first related art). Patent Literature 2 and Non-patent Literature 2 disclose a technology in which, in order to form a silicon thin film on the SiGe channel, after a silicon dioxide film is formed on a SiGe channel, the formed silicon dioxide film is heat-treated to increase Si composition at a SiGe/silicon dioxide film interface, so that a substantial silicon thin film is formed (a second related art). Non-patent Literature 3 discloses an experimental result in which, after Ge and H are bonded by irradiating the surface of Ge deposited on Si with atomic hydrogen, the surface of Ge is heat-treated at about 200° C. to 350° C., so that Si is substituted for Ge in Ge—H bonds at the surface which are energetically unstable on the Ge surface, and the ratio of more stable Si—H bonds are increased (a third related art).

CITATION LIST

Patent Literature

[Patent Literature 1] U.S. Unexamined Patent Application Publication No. 2016/0190286
[Patent Literature 2] U.S. Unexamined Patent Application Publication No. 2018/0026100

Non-Patent Literature

[Non-patent Literature 1] G. Tsutsui et al., "Leakage aware Si/SiGe CMOS FinFET for low power applications", Proceedings of VLSI Symposium 2018, 2018, pp. 87 to 88
[Non-patent Literature 2] P. Hashemi et al., "High Performance and Reliable Strained SiGe PMOS FinFETs Enabled by Advanced Gate Stack Engineering", Proceedings of IEDM 2017, 2017, pp. 824 to 827
[Non-patent Literature 3] E. Rudkevich et al., "Hydrogen Induced Si Surface Segregation on Ge-Covered Si(001)", Physical Review Letters vol. 81, 1998, pp. 3467 to 3470

SUMMARY OF INVENTION

Problem to be Solved by the Invention

In the first related art, it becomes necessary to clean the surface of the SiGe channel in a hydrogen atmosphere before executing an epitaxial growth method. This process is executed in the same chamber where the epitaxial growth is executed in order to remove impurities bonding with dangling bonds along with hydrogen on the surface of the channel by heat-treating the surface of the channel at a temperature from about 750° C. to 850° C. Since the melting point of SiGe is about 960° C., if a high heat load is given to the SiGe channel, the diffusion or strain relaxation of Ge tends to be induced, therefore there is a problem that the reduction of the Ge composition of the SiGe channel and the reduction of carrier mobilities owing to the strain relaxation tend to be induced. In addition, the growth speed of epitaxial growth is greatly affected by the plane orientation of a crystal. In the case of a FinFET, since the growth on the sidewall of a channel in the (110) plane orientation is slow, and the growth on a channel top in the (100) plane orientation is fast, the formation of a Si passivation film having uniform film thicknesses is difficult. Furthermore, it is difficult that atomic layers grow layer by layer in the initial stage of the growth of the Si passivation film owing to strain energy generated between the SiGe channel and the Si passivation film, so that it is believed that the Si passivation film starts to grow in island shapes. Therefore, in order for the Si passivation film to completely cover the surface of the SiGe channel, the passivation film has to have a certain level of thickness. Hereby, there is a possibility that the Si passivation film works as a channel, so that the mobilities of carriers are greatly deteriorated.

In the second related art, the surface of a SiGe channel is oxidized by thermal oxidation or plasma oxidation. An oxide film formed in this way mixedly includes silicon dioxide ($SiO_2$) films and germanium dioxide ($GeO_2$) films. $GeO_2$ is vaporized by heat-treating this oxide film at a temperature from 600° C. to 750° C., so that the greater part of the composition of the oxide film can be made of $SiO_2$. In the process of this heat treatment, Ge atoms are replaced by Si atoms at an interface between the SiGe channel and the oxide film so that the number of Si-oxygen atomic bonds is predominantly larger than the number of Ge-oxygen atomic bonds, with the result that a thin Si layer is formed at the interface between the SiGe channel and the oxide film. As described above, the second related art can provide a Si passivation film thinner than a Si passivation film provided by the first related art, and in addition to that, it is believed that the thickness of the passivation film provided by the second related art does not heavily depend on the plane orientation of the passivation film itself. However, as is the case with the first related art, there remains a problem that the reduction of carrier mobilities tend to be induced owing to the reduction of Ge composition and the strain relaxation caused by the heat treatment.

The present inventors have examined whether it is possible to form a Si passivation film between a SiGe channel and a gate insulating film without executing high temperature heat treatment by using knowledge (a Si segregation phenomenon) disclosed by Non-patent Literature 3 that is the third related art. In this case, after forming a fin structure composing a SiGe channel on a wafer in an etching apparatus, in order to irradiate the wafer with atomic hydrogen, it is necessary that the wafer should be brought out of the etching apparatus, and should be put in an annealing apparatus or a CVD (Chemical Vapor Deposition) apparatus where hydrogen treatment is executed. Therefore, it is necessary to realize a condition in which impurities and the like are not bonded to dangling bonds on the surface of the channel before the hydrogen termination treatment is executed in the annealing apparatus or the CVD apparatus. As a result, it becomes necessary to execute wet cleaning on the surface of the wafer by using, for example, hydrogen fluoride (HF) solution, hydrogen chloride (HCl) Solution, or the like. However, it is difficult to hydrogen-terminate dangling bonds possessed by Ge atoms on the surface of SiGe by the wet cleaning, and there remains a possibility that impurities and the like in the atmosphere bonds with dangling bonds after the wet cleaning. Furthermore, Ge is apt to be oxidized in the atmosphere, and a germanium dioxide film is water-soluble, so that there is fear that Ge atoms in Ge—O bonds melt in the wet cleaning solution. If Ge atoms melt, there is fear that the variation of the width of the SiGe channel and the increase of the roughness of the surface of the SiGe channel occur. As described above, in each of the first to third related arts, a high thermal load or wet cleaning is needed in order to form the Si passivation film on the surface of the SiGe channel, and this high thermal load or wet cleaning causes damage to the SiGe channel.

On the contrary, the present inventors have obtained knowledge that, when low-temperature hydrogen plasma processing is performed on a SiGe blanket sample, a Si segregation phenomenon is induced and the composition of a SiGe surface can be improved to the extent that the SiGe surface become Si-rich. From the experiment result, the following facts are found:
(1) A Si segregation phenomenon occurs in the vicinity of the surface of the sample.
(2) As ion energy gets larger, Si/Ge ratios in the vicinity of the surface of the sample are more decreased further.
(3) As ion energy gets larger, the etching rates of polycrystalline Si and SiGe are more decreased further.

An object of the present invention is to establish a process capable of forming a Si segregation layer for protecting a SiGe layer without damaging the SiGe layer in the manufacturing process of a three-dimensional structure device having a SiGe channel such as a fin type FET or a GAA type FET, and to provide a plasma processing apparatus capable of executing the abovementioned process.

Means for Solving the Problems

A manufacturing method of a semiconductor device that is an aspect of the present invention includes a first step for performing plasma processing on a semiconductor substrate including at least a silicon layer and a silicon germanium layer formed on the silicon layer under a first condition to expose the silicon germanium layer; and a second step for performing plasma processing on the semiconductor substrate under a second condition to segregate silicon on the surface of the exposed silicon germanium layer. The first condition is a condition under which the silicon germanium layer or layers lying adjacent to the silicon germanium layer can be etched, the second condition is a condition under which hydrogen plasma processing is performed, and the first step and the second step are executed in series in the same processing chamber of a plasma processing apparatus.

A plasma processing apparatus that is another aspect of the present invention is a plasma processing apparatus that performs plasma processing on a semiconductor substrate including at least a silicon layer and a silicon germanium layer formed on the silicon layer. The plasma processing apparatus includes: a processing chamber that keeps the semiconductor substrate in a vacuum environment; a sample support that is disposed in the processing chamber and on which the semiconductor substrate is mounted; a gas supply mechanism that supplies source gas used for plasma processing to the processing chamber; a high frequency power source for generating plasma used for the plasma processing; and a control unit. The control unit executes a first step in which the silicon germanium layer is exposed by performing plasma processing on the semiconductor substrate under a first condition and a second step in which silicon is segregated on the surface of the exposed silicon germanium layer in series by performing plasma processing on the semiconductor substrate under a second condition, and the gas supply mechanism supplies source gas used for etching the silicon germanium layer or layers adjacent to the silicon germanium layer to the processing chamber in the first step and supplies hydrogen gas to the processing chamber in the second step on the basis of instructions from the control unit.

Effect of the Invention

In the manufacturing process of a semiconductor device including a SiGe channel, it becomes possible to form a Si segregation layer for protecting the SiGe channel without damaging the SiGe channel.

Other problems and new characteristics of the present invention will be explicitly shown by the following descriptions of the present specification and the accompanying drawings.

MODES FOR CARRYING OUT THE INVENTION

Hereinafter, the embodiments of the present invention will be explained with reference to the accompanying drawings. Here, the present invention is not limited to embodiments to be hereinafter described, and the present invention can include various kinds of modifications within the scope of the technological concept of the present invention. Through all drawings used for explaining the embodiments, members that have the same functions are given the same reference signs, and redundant explanations about the members will be omitted. In addition, it goes without saying that many modifications can be made by changing combinations of materials and manufacturing processes regarding the contents disclosed in the following embodiments of the present invention. Furthermore, the contraction scales of the drawings are not always correctly adjusted, and instead the drawings are depicted in such a way that the important portions of the drawings are schematically emphasized in order to make logics clear.

Embodiment 1

Figure 1:
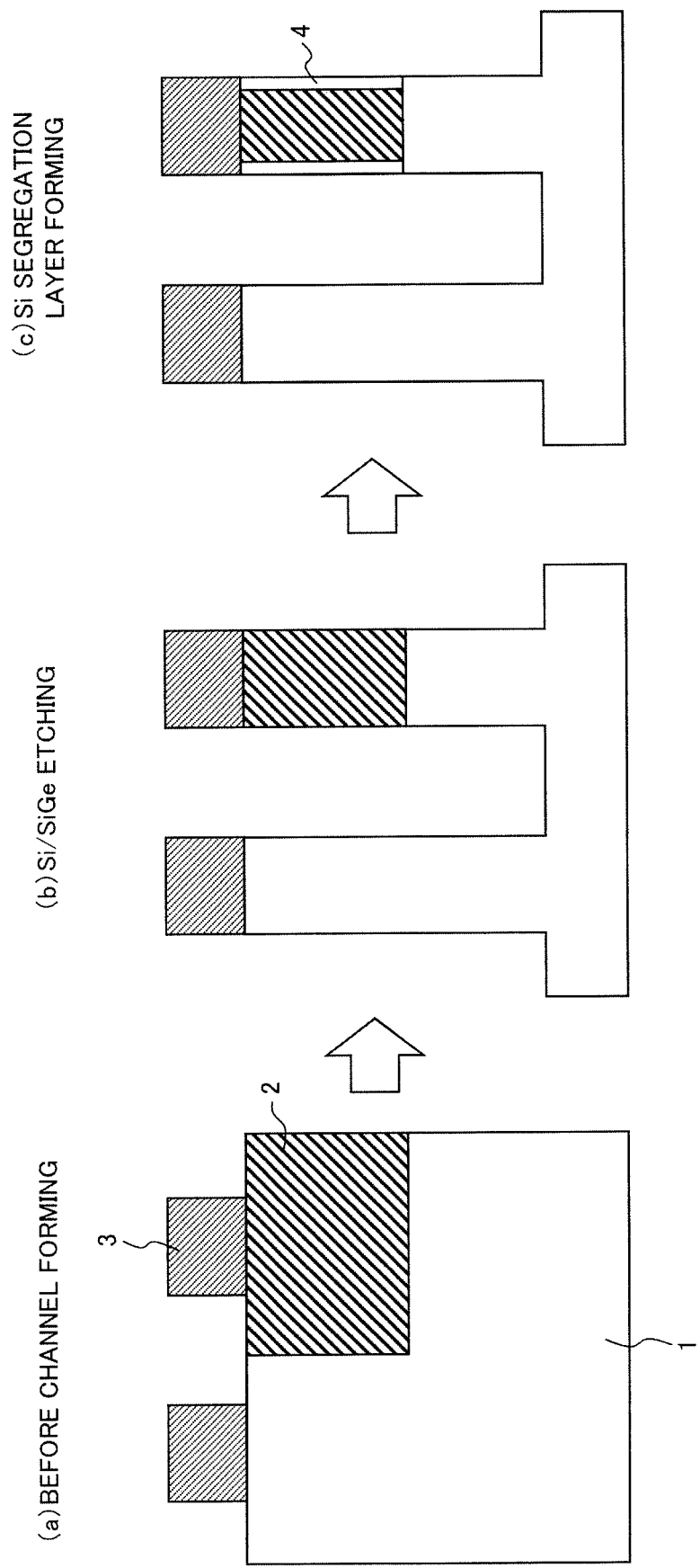
FIG. 1 are diagrams showing the channel forming method of a semiconductor device including a SiGe channel according to Embodiment 1.

FIG. 1 show the channel forming method of a semiconductor device including a silicon germanium (SiGe) channel according to Embodiment 1. FIG. 1(a) shows a silicon (Si) substrate before a channel forming process is executed. A groove is formed in a part of the Si substrate (monocrystal Si layer) 1, and a monocrystal SiGe layer 2 is buried in the groove. It is desirable that the film thickness of the SiGe layer 2 should be 30 nm to 100 nm, and it is preferable that germanium (Ge) composition in the SiGe layer 2 should be 20% to 25%. In order to realize high mobility characteristics, the SiGe layer 2 is formed so as to be lattice matched with the Si substrate 1, and strain energy owing to the difference between the lattice constant of SiGe and that of Si is stored inside SiGe. Therefore, higher mobility is realized in the SiGe layer 2 in comparison with a relaxed SiGe layer. The SiGe layer 2 can be formed in such a way that, after growing SiGe film on the Si substrate 1, in which a groove is formed by patterning, using, for example, a chemical vapor disposition (CVD) method, the surface of the SiGe film is flattened using chemical mechanical polishing (CMP). Alternatively, it is conceivable that the SiGe film is formed only in the groove by executing selective epitaxial growth on Si selective to an insulating film mask, which is used for making the groove by etching, using a CVD method or the like.

A patterned hard mask 3 is formed on the Si substrate 1 and the SiGe layer 2. The hard mask 3 has a periodic pattern, and it is desirable that the pitch of the pattern period should be 20 nm to 50 nm. In the formation of the hard masks 3, in the case where a laser, the light source of which is, for example, argon fluoride (ArF) gas, is used for the lithography patterning, if the pattern period is equal to or more than 40 nm and equal to or less than 80 nm, self-aligned double patterning (SADP) can be used, and if the pattern period is equal to or more than 20 nm and equal to or less than 40 nm, self-aligned quadruple patterning (SAQP) can be used. Furthermore, in the case where exposure in the lithography patterning is executed using extreme ultraviolet with its wavelength 13.5 nm, if the pattern period is 40 nm or less, single patterning can be used, and if the pattern period is 20 nm or more and 40 nm or less, SADP can be used. The hard mask 3 is made of an insulating film such as a silicon dioxide ($SiO_2$) film or a silicon nitride ($Si_3N_4$) film. Alternatively, the hard mask 3 is made of an insulating film such as a silicon oxynitride (SiON) film or a silicon oxycarbide (SiCO) film each of which is a quasi $SiO_2$ film or a quasi $Si_3N_4$ film. Or it is conceivable that the hard mask is made of an insulating film made of a wide band gap material such as amorphous silicon carbon (SiC) or made of a laminated film made of plural insulating films.

The substrate formed so as to have a structure shown in FIG. 1(a) is introduced into a plasma processing apparatus, and the SiGe layer 2 and part of the Si substrate 1 are etched using the hard mask 3 as a mask. The etching is executed under a condition of anisotropic etching under which etching is executed while the direction of the etching is kept perpendicular to the surface of the substrate. After the etching, a fin structure shown in FIG. 1(b) is formed.

Subsequently, while the substrate is held in the same processing chamber of the same apparatus, hydrogen treatment is executed using hydrogen ($H_2$) gas, so that an ultrathin film Si segregation layer 4 is formed on the surface of the SiGe channel as shown in FIG. 1(c). As described later, since the ultrathin film Si segregation layer 4 can be formed even if materials removed by the etching adhere to the surface of the SiGe channel again, a cleaning process between the etching process shown in FIG. 1(b) and the Si segregation layer forming process shown in FIG. 1(c) is unnecessary, so that damage to the SiGe layer owing to the cleaning process can be avoided. In addition, since the processing temperatures of the sequential processes shown in FIGS. 1(b) to (c) are almost room temperatures, the composition change of the SiGe channel owing to the diffusion of Ge and the decrease of mobilities owing to the strain relaxation can be suppressed.

Figure 2:
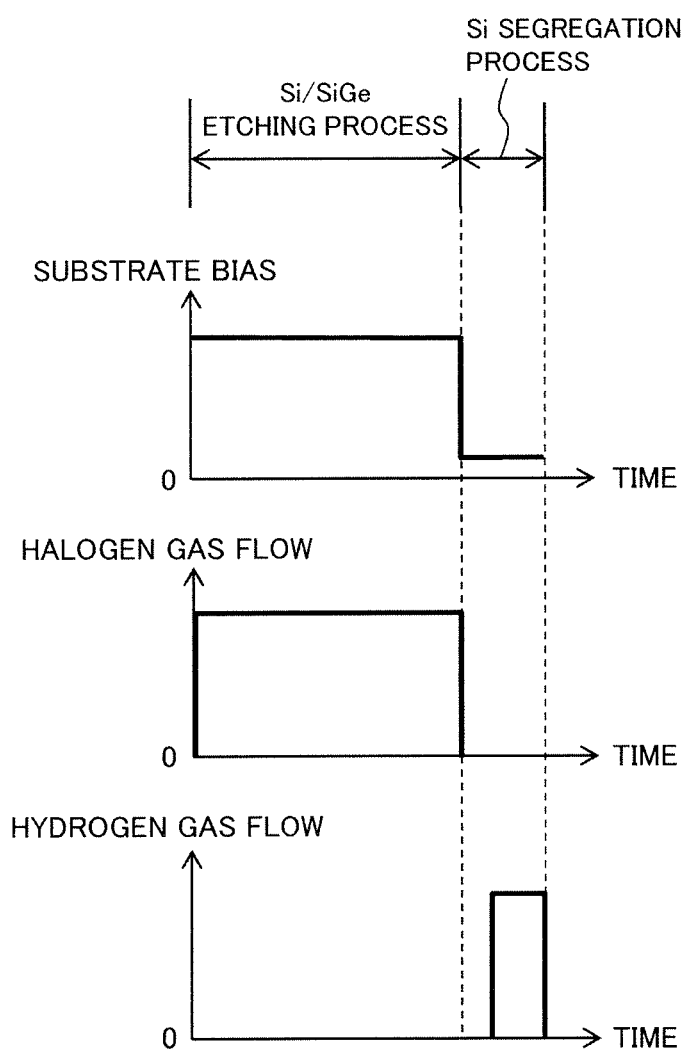
FIG. 2 is a diagram showing the processing conditions of a plasma processing apparatus according to Embodiment 1.

Processing conditions for the plasma processing apparatus in these sequential processes are shown in FIG. 2. In the etching of the SiGe layer 2 and the Si substrate 1 using the hard mask 3 as a mask, it is preferable to use gas including halogen gas such as chlorine ($Cl_2$), hydrogen bromide (HBr) as a source gas. With the use of such etching gas, it becomes possible to etch the SiGe layer 2 and the Si substrate 1 with excellent selectivity to mask materials such as $SiO_2$ and $Si_3N_4$. Furthermore, in order for the etching to be executed so that perpendicularity is kept to the surface of the substrate, a high frequency bias is applied to the substrate. Since ions in plasma are drawn up to the substrate, the etching can be executed while the perpendicularity is kept. On the other hand, in the plasma processing for forming the Si segregation layer 4, hydrogen gas is mainly used. In this case, in order to irradiate the sidewall of the fin with plasma uniformly from the upper part to the lower part of the sidewall of the fin, the plasma processing is performed under a condition that the magnitude of the high frequency bias applied to the substrate is set lower than in the case of executing the etching, or no high frequency bias is applied to the substrate. This condition coincides with knowledge that, the smaller ion energy is, the higher a Si/Ge ratio in the vicinity of the surface of the sample becomes. However, to set ion energy small brings about an operation that the etching rate of the Si layer and that of the SiGe layer are heightened as well. Therefore, the hydrogen plasma processing is performed under a condition that fins formed in the SiGe layer 2 and Si substrate 1 are etched as little as possible. For example, it is conceivable that the hydrogen plasma processing is performed in a shorter time. In such a way, in order to meet respective conditions for the etching process and the segregation process, the processing conditions such as pressure in the etching chamber, a high frequency bias applied to the substrate, a gas flow, a process time, and the like are controlled.

Figure 3:
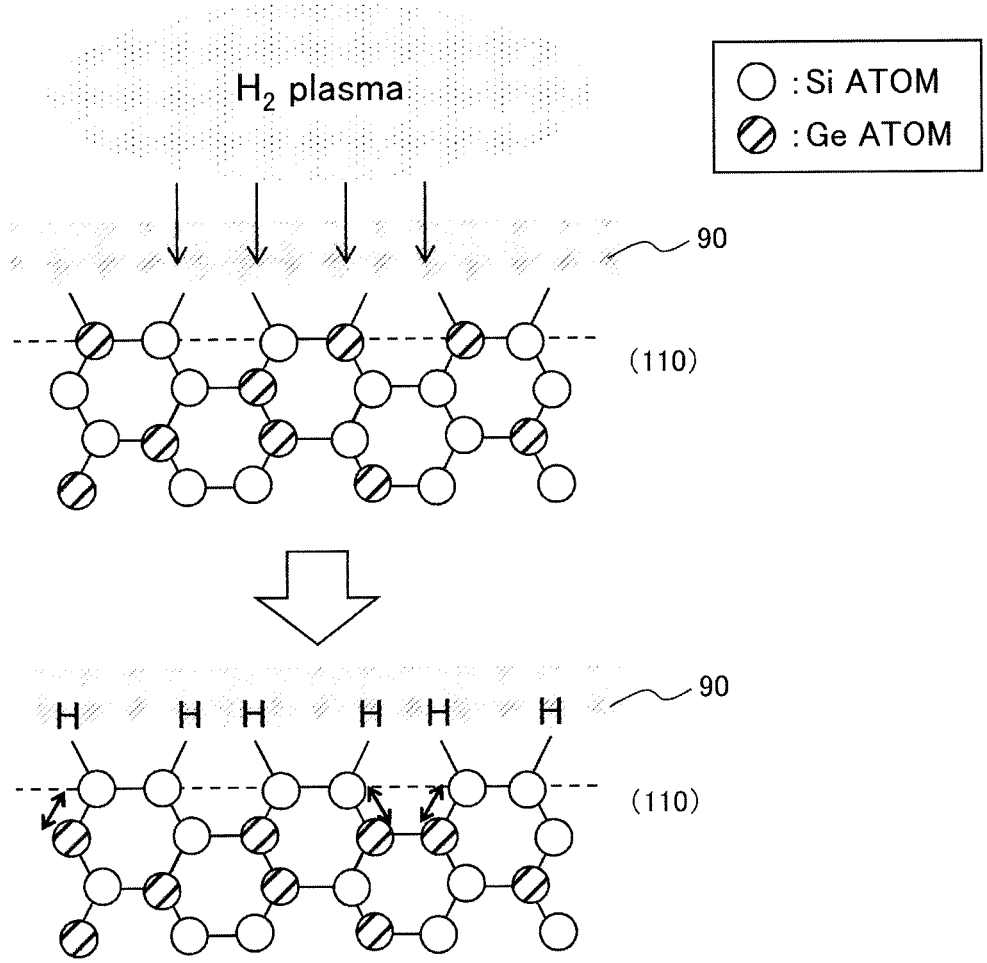
FIG. 3 is a schematic diagram showing the forming process of an ultrathin film Si segregation layer.

FIG. 3 shows a schematic diagram showing the forming process of the ultrathin film Si segregation layer 4 in a SiGe fin. In order to show a hydrogen plasma processing effect on the sidewall of the SiGe fin, a (110) plane corresponding to the sidewall of the SiGe fin is represented as the surface of the SiGe layer 2. In addition, redeposition objects 90, which are generated when the etching is executed to shape the SiGe fin, are deposited on the sidewall of the SiGe fin. As shown in FIG. 3, when hydrogen plasma is irradiated to the surface of the SiGe layer 2, the hydrogen plasma penetrates a redeposition object layer 90, and works on the SiGe layer 2, so that the dangling bonds of Si atoms and those of Ge atoms on the surface of the SiGe layer 2 are terminated with hydrogen atoms. With this, silicon-hydrogen (Si—H) bonds and germanium-hydrogen (Ge—H) bonds mixedly exist on the surface of the SiGe layer. Since energy possessed by a Si—H bond is more stable than that possessed by a Ge—H bond, Si atoms are replaced with Ge atoms inside the SiGe crystal, so that Si atoms are segregated at the surface of the SiGe layer. Non-patent Literature 3 discloses that, since energy is necessary for the replacement of Ge atoms with Si atoms, a certain level of heat treatment is required. On the other hand, since a reaction is brought about by the hydrogen plasma processing in this embodiment, the hydrogen atoms that terminate the dangling bonds respond to the surface of the SiGe layer in their radical states having high energies. It is believed that, since the energies possessed by the radicals propagate through the surface of the SiGe layer, Ge atoms are replaced with Si atoms in the vicinity of the surface of the SiGe layer. Particularly, the formation of the Si segregation layer 4 occurs not only on a SiGe blanket sample which surface is clean but also on a sample under processing which a redeposition object layer exists, with the result that the sequential processes of these embodiments become possible. Here, to keep temperature inside the chamber of the plasma processing apparatus at room temperature (about 27° C., up to 100° C.) makes it possible to prevent the desorption phenomena of hydrogen atoms from occurring.

Since the hydrogen plasma reaction is a reaction that occurs on the surface of the SiGe layer, the Si segregation reaction is completed in a very short time of less than 1 second, so that, even if hydrogen irradiation is executed afterward, the reaction does not continue to occur in the depth direction of the SiGe layer. The thickness of the ultrathin film Si segregation layer to be formed does not change depending on the penetration depth of the hydrogen radicals into the SiGe layer. Instead, since there is fear that the excess processing time of the hydrogen plasma processing and the excess penetration depth of the hydrogen radicals into the SiGe crystal cause damage to the SiGe channel, it is necessary that plasma processing conditions such as the processing time and the substrate bias should be adjusted so as the SiGe channel is not to be excessively damaged. As an example of a hydrogen plasma processing time, it is desirable that the hydrogen plasma processing time should be adjusted so as to be within a range from several seconds to 20 seconds or less. According to the result of the study obtained up to now, it has been grasped that the thickness of Si segregation layer formed by a Si segregation phenomenon is less than 1 nm, and the penetration depth of hydrogen necessary for causing the Si segregation phenomenon is several nm.

The above-described Si segregation effect is a phenomenon caused under a considerably wide hydrogen plasma condition, and a plasma processing apparatus capable of generating this phenomenon can be any of an etching apparatus using inductively coupled plasma (ICP), an etching apparatus using capacitively coupled plasma (CCP), and an etching apparatus using microwave electron cyclotron resonance (ECR) plasma. Hereinafter, the following explanations are made under the assumption that a plasma processing apparatus using microwave ECR plasma is adopted. In the following embodiments, a semiconductor apparatus can also be configured using the abovementioned plasma processing apparatuses.

Figure 4:
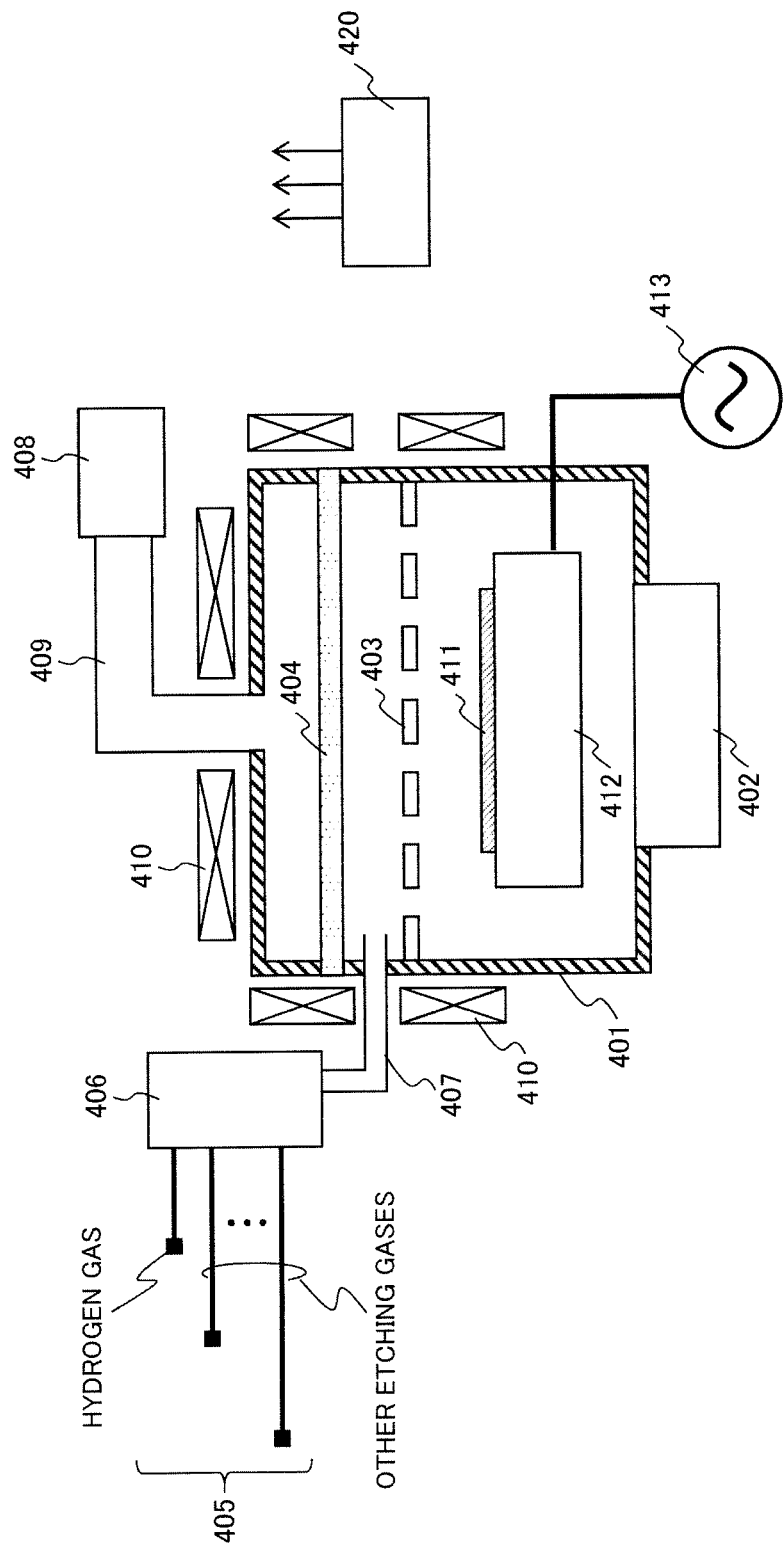
FIG. 4 is the block diagram of a plasma processing apparatus using microwave ECR plasma.

FIG. 4 shows the configuration of a plasma processing apparatus using microwave ECR plasma. The plasma processing apparatus includes a processing chamber 401, the processing chamber 401 is connected to a vacuum exhaust device (not shown) via a vacuum exhaust opening 402, and air pressure in the processing chamber 401 is kept almost vacuum, that is, about 0.1 Pa to 10 Pa. Furthermore, a shower plate 403 and a window unit 404 are installed in the upper part of the processing chamber 401. The shower plate 403 has plural holes, and the material of the shower plate is, for example, quartz. A gas supply mechanism includes a gas source 405, a gas supply device 406, and a gas introduction opening 407, and supplies source gas used for plasma processing. The gas source 405 supplies at least a gas type necessary for etching a fin structure (for example, a single or plural gas types mainly composed of halogen gas) and hydrogen gas necessary for causing Si segregation. The gas supply device 406 includes a control valve for controlling the supply/cutoff of gas and a mass flow controller for controlling a gas flow. In addition, the gas introduction opening 407 is installed between the shower plate 403 and the window unit 404, and the gas introduction opening 407 introduces gas for plasma etching or hydrogen processing into the processing chamber 401 through the holes of shower plate 403. The window unit 404 makes electromagnetic waves penetrate from above the processing chamber through itself, and at the same time, plays a role of sealing the upper part of the processing chamber airtightly. As the material of the window unit 404, dielectric material such as quartz is used.

A waveguide 409 for propagating an electric wave is connected to the upper part of the processing chamber 401, and a high frequency power source 408 for generating plasma is connected to an end of the waveguide 409. The high frequency power source 408 for generating plasma is a power source for generating an electric wave for generating plasma, and, as the electric wave for generating plasma, a microwave of frequency 2.45 GHz is used for example. A microwave generated by the high frequency power source 408 for generating plasma propagates the waveguide 409 and enters the processing chamber 401. Since the waveguide 409 includes a waveguide converter that plays both roles of a vertical waveguide extending in the vertical direction and a corner that bends the direction of the microwave at a right angle, the microwave enters the processing chamber 401 perpendicularly. The microwave propagates the processing chamber 401 perpendicularly via the window unit 404 and the shower plate 403. Magnetic field generating coils 410 disposed in the periphery of the processing chamber 401 form a magnetic field in the processing chamber 401. The microwave transmitted from the high frequency power source 408 for generating plasma generates high-density plasma in the processing chamber 401 owing to an interaction with the magnetic field generated by the magnetic field generating coils 410.

A sample support 412 is disposed in the lower part of the processing chamber 401 in such a way as to face the window unit 404. As the material of the sample support 412, aluminum or titanium is used. The sample support 412 holds a semiconductor substrate 411 that is a sample in such a way that the semiconductor substrate 411 is mounted on the upper surface of the sample support 412. Here, the central axes of the waveguide 409, the processing chamber 401, the sample support 412, and the semiconductor substrate 411 coincide with one another. Furthermore, an electrode for electrostatically absorbing the semiconductor substrate 411 is installed inside the sample support 412, and by applying a DC voltage to the electrode, the semiconductor substrate 411 is electrostatically absorbed to the sample support 412. In addition, a high frequency voltage is applied to the sample support 412 from a high frequency bias power source 413.

It is preferable to set the frequency of the applied high frequency bias to 400 Hz for example.

Respective mechanisms of the plasma processing apparatus are controlled by a control unit 420 (connections between the control unit 420 and the respective mechanisms are not shown in FIG. 4). The control unit 420 specifies the executions of predefined behaviors to the respective mechanisms respectively in accordance with the conditions of processes to be executed by the plasma processing apparatus, so that the respective mechanisms are controlled by the control unit 420. For example, the control unit 420 controls the high frequency power source 408 for generating plasma, so that the on-off operation of the electric wave for generating plasma is controlled by the control unit 420. Furthermore, the control unit 420 controls the gas supply mechanism, and adjusts the type of gas, the flow of gas, and the like that are introduced into the processing chamber 401. In addition, the control unit 420 controls the high frequency bias power source 413 and controls the strength of the high frequency voltage applied to the semiconductor substrate 411 on the sample support 412.

The microwave ECR plasma processing apparatus is characterized in that a pressure at the time of plasma processing performed by the microwave ECR plasma processing apparatus is lower than a pressure at the time of plasma processing performed by the ICP plasma processing apparatus or the CCP plasma processing apparatus. To perform plasma processing in a low-pressure region makes it possible to obtain an advantageous effect for preventing impurities from being deposited on the surface of the SiGe layer in a series of the plasma processing processes and damage from being done to the surface of the SiGe layer by the plasma processing.

Figure 5A:
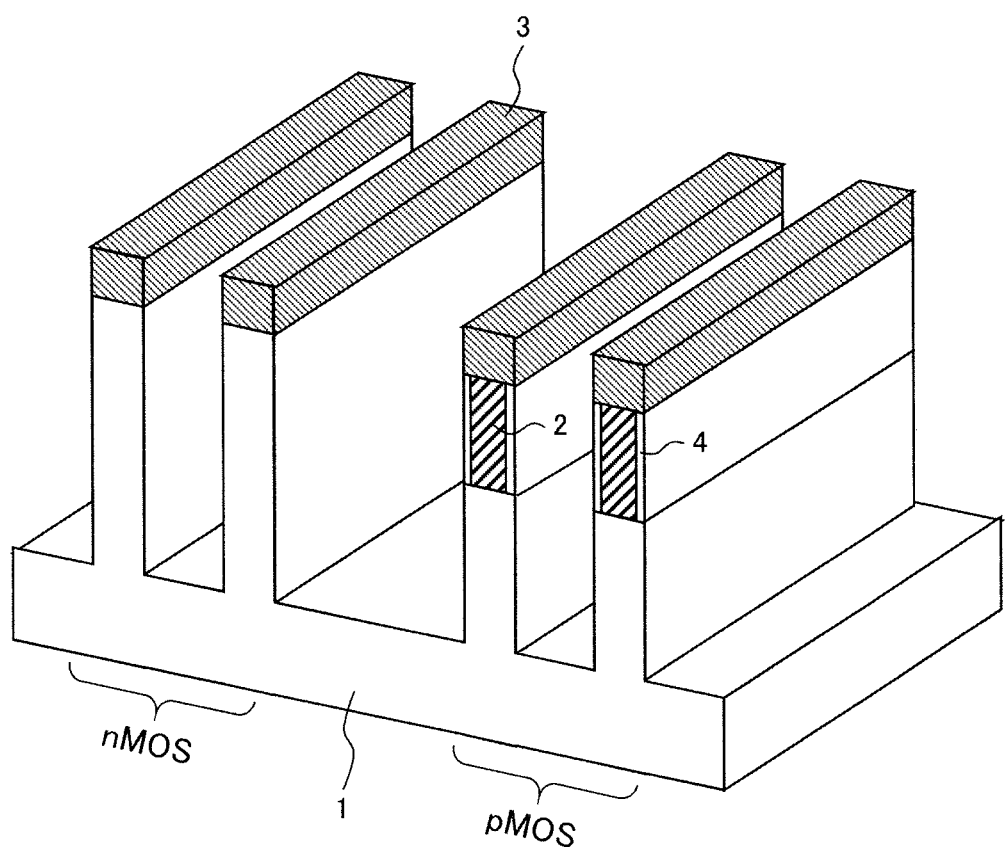
FIG. 5A is a bird's-eye view of a manufacturing process of a semiconductor device including a SiGe channel according to Embodiment 1.

Hereinafter, manufacturing processes of a MOSFET having a fin structure (fin type FET) shown in FIG. 1(*c*) will be explained. FIG. 5A is a bird's-eye view showing a state in which the fin structure shown in FIG. 1(*c*) is manufactured on the Si substrate 1. In this case, a complementary MOSFET (CMOS) including a p type MOSFET and an n type MOSFET is shown as an example. The p type MOSFET has a fin structure of SiGe as its channel, and n type MOSFET has a fin structure of Si as its channel. Furthermore, although each of the p type MOSFET and the n type MOSFET includes two fins in this example, the number of fins is not limited. In addition, as mentioned above, the minimum space between two fin structures is set to be within a range from 20 nm to 50 nm, and the width of a fin is adjusted to be within the range between 5 nm and 20 nm. The height of a fin region that works as a channel (the height corresponds to the thickness of the SiGe layer 2) is limited within a range from 30 nm to 100 nm as mentioned above, and on the other hand, as shown in FIG. 5A, the height of the fin is about 100 nm to 200 nm, and a well region for suppressing a leakage current of a transistor is formed in the lower part of the fin that works as a channel. In the n type MOSFET, a well region that is doped and changed into a p type region is formed, and in the p type MOSFET, a well region that is doped and changed into an n type region is formed. These well regions can be formed by, for example, ion implantation.

For example, before the structure shown in FIG. 1(*a*) is formed, phosphorous (P) ion implantation or arsenic (As) ion implantation is executed on the Si substrate 1 as n type doping, and boron (B) ion implantation or boron fluoride (BF$_2$) ion implantation is executed on the Si substrate 1 as p type doping. After the abovementioned ion implantations, heat treatment is executed in order to activate impurities, and the portion of a channel that is not doped is formed by executing epitaxial growth in such a way that the thickness of the portion of the channel becomes 30 nm to 100 nm. Subsequently, as explained in FIG. 1, the buried SiGe layer 2 is formed and then the fin structure is formed. Here, the well doping can also be executed using solid phase growth or plasma doping, and if the solid phase growth is executed, well regions can be formed after the formation of the fin structure.

Figure 5B:
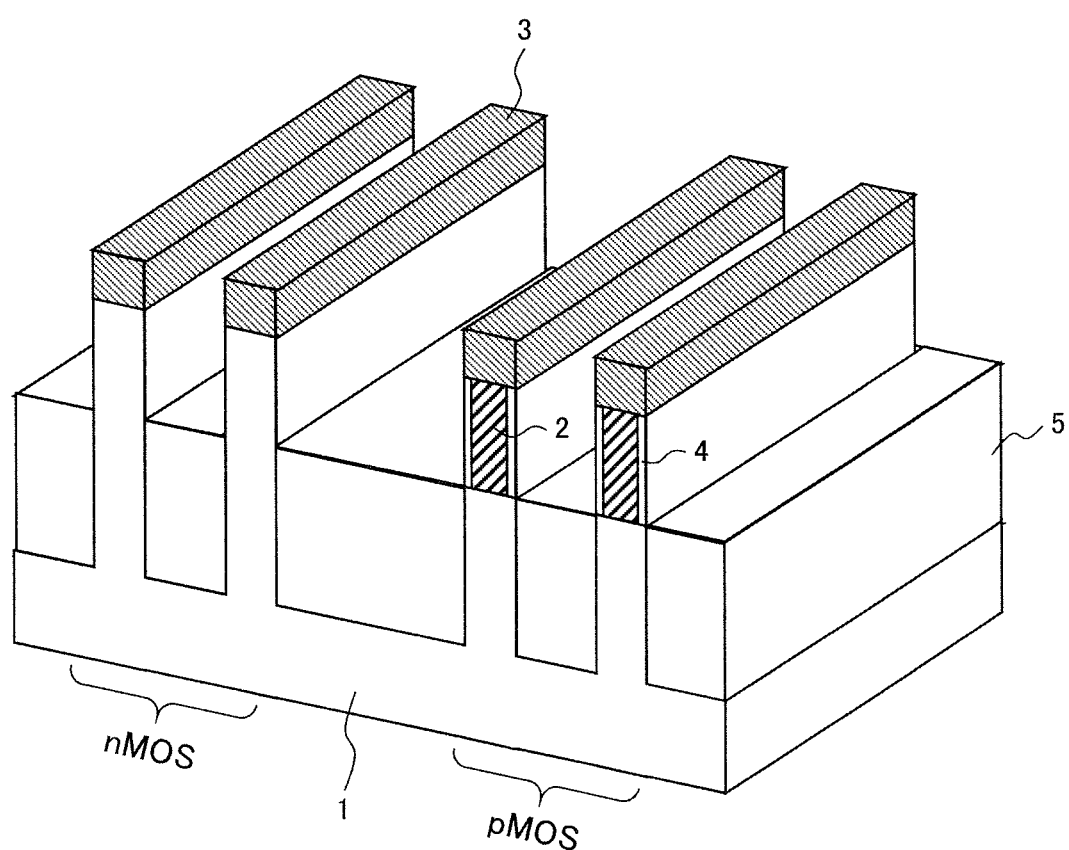
FIG. 5B is a bird's-eye view of a manufacturing process of the semiconductor device including the SiGe channel according to Embodiment 1.

Next, in order to form an element isolation region, STI (Shallow Trench Isolation) insulating film is deposited and the STI insulating film is etched back, so that a structure shown in FIG. 5B is obtained. The STI insulating film 5 is made using a CVD method or the like. It is conceivable that the material of the STI insulating film 5 is SiO$_2$. Alternatively, the material of the STI insulating film 5 can be SiON or SiCO (each of SiON and SiCO is quasi SiO$_2$). The thickness of the STI insulating film 5, which is deposited first, is set equal to the sum of the height of the entirety of a fin and the height of a hard mask 3 or larger. Subsequently, CMP is carried out using the upper part of the hard mask 3 as a stopper, and after the flattening is carried out, etching back is executed using dry etching to expose a fin region that works as a channel, so that the structure shown in FIG. 5B is obtained. The depth of the etch-back is adjusted to be 30 nm to 100 nm in accordance with the channeled fin region of the MOSFET, and it is preferable that the upper surface of the STI insulating film 5 after etch-back should be adjusted to be disposed at the same level of the bottom surface of the SiGe channel 2 or a little lower. This is because, if the SiGe layer, into which a current tends to flow, remains intact at a position which is lower than the upper surface of the STI insulating film 5, this causes the leakage current of the MOSFET to increase.

If SiO$_2$ is used as the material of the STI insulating film 5, it is preferable that methane tetrafluoride (CF$_4$) or trifluoromethane (CHF$_4$) should be used as etching gas. Furthermore, in the case where SiO$_2$ is used as the material of the STI insulating film 5, it is necessary that etching back of the STI insulating film 5 should be selectively executed on the hard mask 3 on the upper part of the fin, so that it is desirable that the material of the hard mask 3 should be material other than SiO$_2$ such as Si$_3$N$_4$. In addition, in the case where a well region is formed after the formation of the fin structure as mentioned above, at the time when the STI insulating film 5 is deposited first, insulating films into which respective impurities are doped are deposited within a range where the well region is formed, and well doping can be executed in such a way that heat treatment is executed on the deposited impurities after the deposited impurities are etched back, which diffuses the impurities in the lower part of the fin region that works as a channel (a solid phase growth method).

Furthermore, it is conceivable that the Si segregation layer is formed on the surface of the SiGe layer by performing the hydrogen plasma processing again after the STI insulating film 5 is etched back. The above processing is performed because there is fear that the ultrathin film Si segregation layer 4 is damaged in the process of etching back the STI insulating film 5, and it is necessary to recover the damaged ultrathin film Si segregation layer 4. Since the Si segregation reaction is a reaction that occurs at the surface of the SiGe layer, even if this reaction is repeated, the ultrathin film Si segregation layer 4 having uniform thickness can be formed.

Figure 5C:
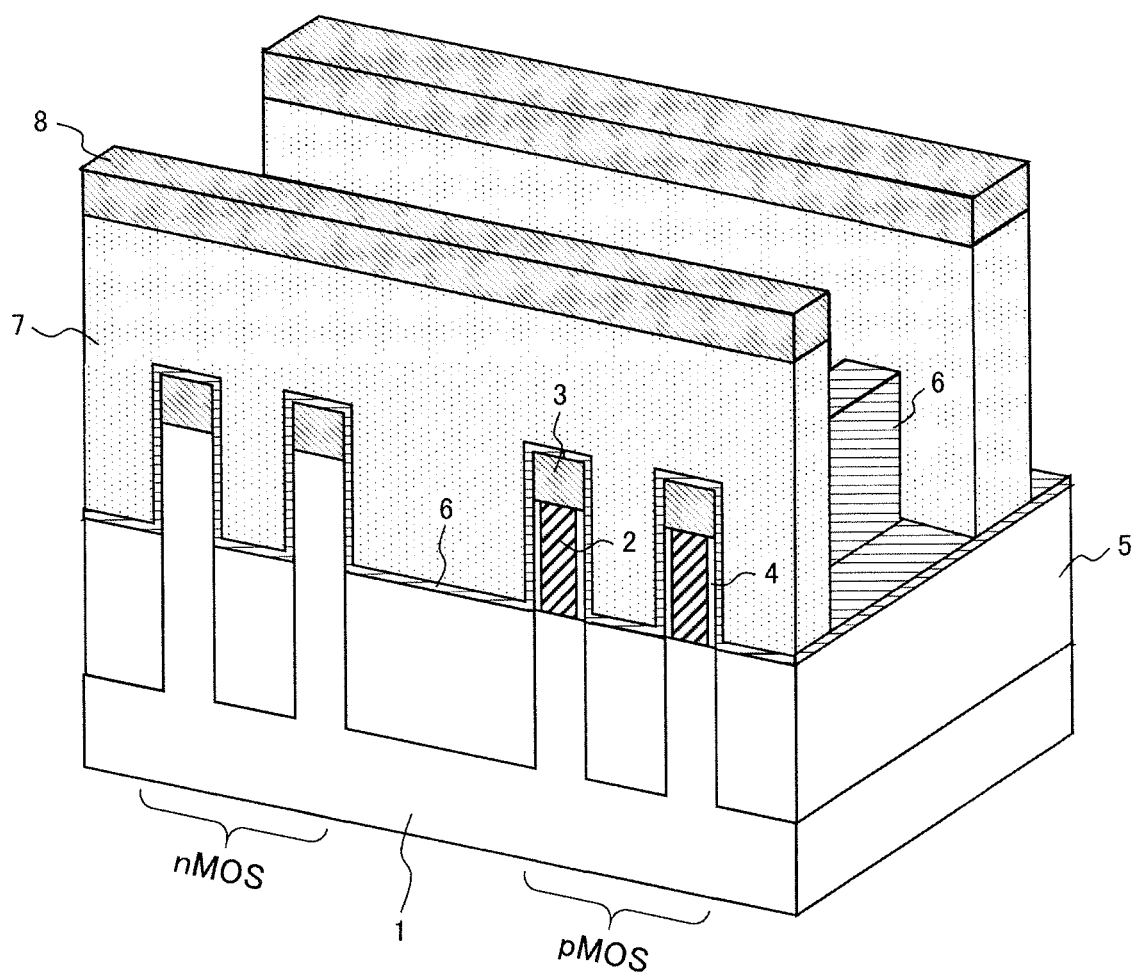
FIG. 5C is a bird's-eye view of a manufacturing process of the semiconductor device including the SiGe channel according to Embodiment 1.

Next, a dummy gate insulating film 6, dummy gates 7, and hard masks 8 are deposited using a CVD method or the like, patterning and etching is executed on the hard masks 8 in this order, and then etching is executed on the dummy gates 7 using the patterned hard masks 8 as masks, with the result that a structure shown in FIG. 5C is obtained. It is preferable that the dummy gate insulating film 6 should be an insulating film made of $SiO_2$ or made of an insulating film made of pseudo-$SiO_2$, and it is also desirable that the thickness of the dummy gate insulating film 6 should be within a range from 1 nm to 3 nm. Here, it is also conceivable that the dummy gate insulating film 6 is formed by oxidizing a Si fin or a SiGe fin using a thermal oxidation method or a plasma oxidation method. It is preferable that the dummy gates 7 should be made of amorphous Si or polycrystalline Si. The hard masks 8 should be insulating films made of $Si_3N_4$ or $SiO_2$. Alternatively, the hard masks 8 should be insulating films made of SiON or the like that is pseudo-$Si_3N_4$ or pseudo-$SiO_2$. Patterning of the hard masks 8 is executed using a technique selected among an SADP technique, a single exposure technique, and the like in accordance with gate pitches. For example, after setting the gate pitches within a range from 40 nm to 70 nm and the widths of the dummy gates 7 within a range from 15 nm to 30 nm, the hard masks 8 are patterned. As for the etching of the hard masks 8, in the case where $Si_3N_4$ is used as the material of the hard masks 8 for example, the selection ratio of the hard masks 8 to the base dummy gates 7 can be kept high by using mixed gas of $CF_4$ and oxygen to which $Cl_2$ or the like is added. In the case of the etching of the dummy gates 7, selective etching, in which the base dummy gate insulating film 6 is used as a stopper, can be executed by using halogen-based gas such as $Cl_2$ or HBr. Here, in Embodiment 1, while the hard masks 3 in the upper parts of the fins are left intact, the dummy gates 7 are deposited and processed. This structure has an advantageous effect in that the hard masks 3 work as passivation films for fin channels when the dummy gates 7 are etched, so that etching damage to the channels is alleviated.

Figure 5D:
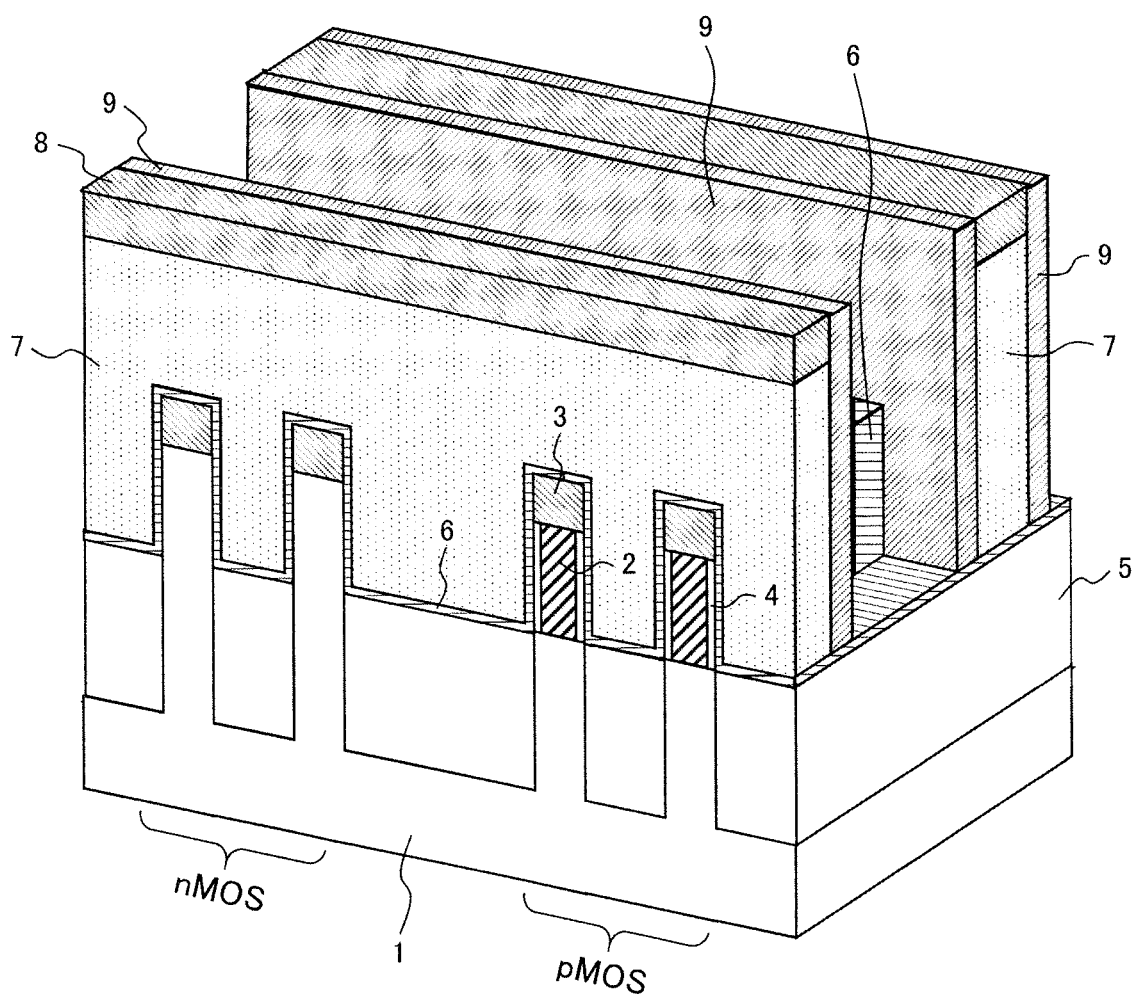
FIG. 5D is a bird's-eye view of a manufacturing process of the semiconductor device including the SiGe channel according to Embodiment 1.

After the process of the dummy gates 7, gate sidewall insulating films 9 are deposited using a CVD method or the like, and anisotropic etching is executed on the gate sidewall insulating films 9, so that a structure shown in FIG. 5D is obtained. It is preferable that the gate sidewall insulating films 9 should be made of SiON films, which are low relative permittivity films, SiOCN films, which are films made of carbon-containing SiON, or carbon-containing silicon dioxide (SiCO) films. In the case where the gate sidewall insulating films 9 is made of SiCO films, it is preferable that mixed gas of $CF_4$ and octafluorocyclobutane ($C_4F_8$) to which nitrogen ($N_2$) is added should be used as etching gas for the anisotropic etching of the gate sidewall insulating films 9. The horizontal thicknesses of the gate sidewall insulating films 9 should be adjusted to be within a range from 5 nm to 15 nm.

Figure 5E:
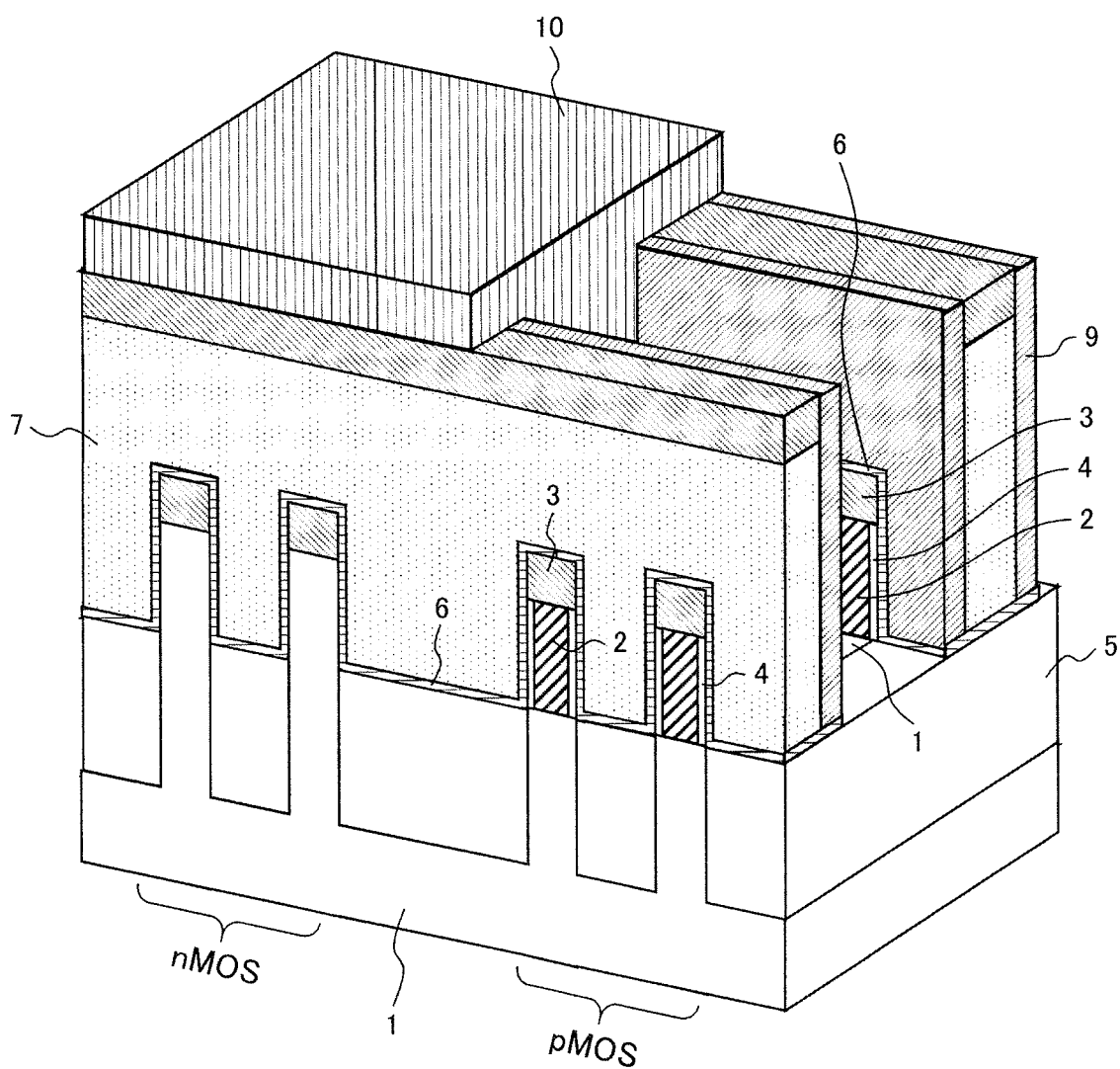
FIG. 5E is a bird's-eye view of a manufacturing process of the semiconductor device including the SiGe channel according to Embodiment 1.

Next, a hard mask 10 is deposited and patterned in such a way that the hard mask 10 covers an n type MOSFET region, and the dummy gate insulating film 6, the hard masks 3 on the fins and the SiGe layer 2 in the source/drain region of the p type MOSFET are removed by etching using the hard mask 10 as a mask, so that a structure shown in FIG. 5E is obtained. Here, it is assumed that the etching executed on the dummy gate insulating film 6, the hard masks 3 on the fins and the SiGe layer 2 is anisotropic etching that keeps the perpendicularity to the surface of the substrate, and further it is assumed that this etching is executed under a condition that only materials subject to etching are selectively etched. $SiO_2$ or insulating film made of pseudo-$SiO_2$ is used as the material of the hard mask 10.

Since these films in the source/drain region of the p type MOSFET are removed, the sidewalls of the SiGe layers (channels) 2 are exposed on the sidewalls of the gate sidewall insulating films 9, and the Si layer or SiGe layer that forms fin structures is exposed on the surface of the STI insulating film 5 in a striped pattern. Whether the surface of the fins exposed on the surface of the STI insulating film 5 is part of the Si layer or part of the SiGe layer is determined on the basis of the depth of the etching, and this etching depth can be adjusted in accordance with the capability of the transistor. For example, the height of the exposed surface of a fin can be adjusted to be within a range from −20 nm to +20 nm relative to the surface of the STI insulating film 5. If the etching depth relative to the fin is deep, the on-current of the transistor increases, but a short channel effect also increases. On the other hand, if the etching depth relative to the fin is shallow, the short channel effect is suppressed, but the on-current also decreases.

Figure 5F:
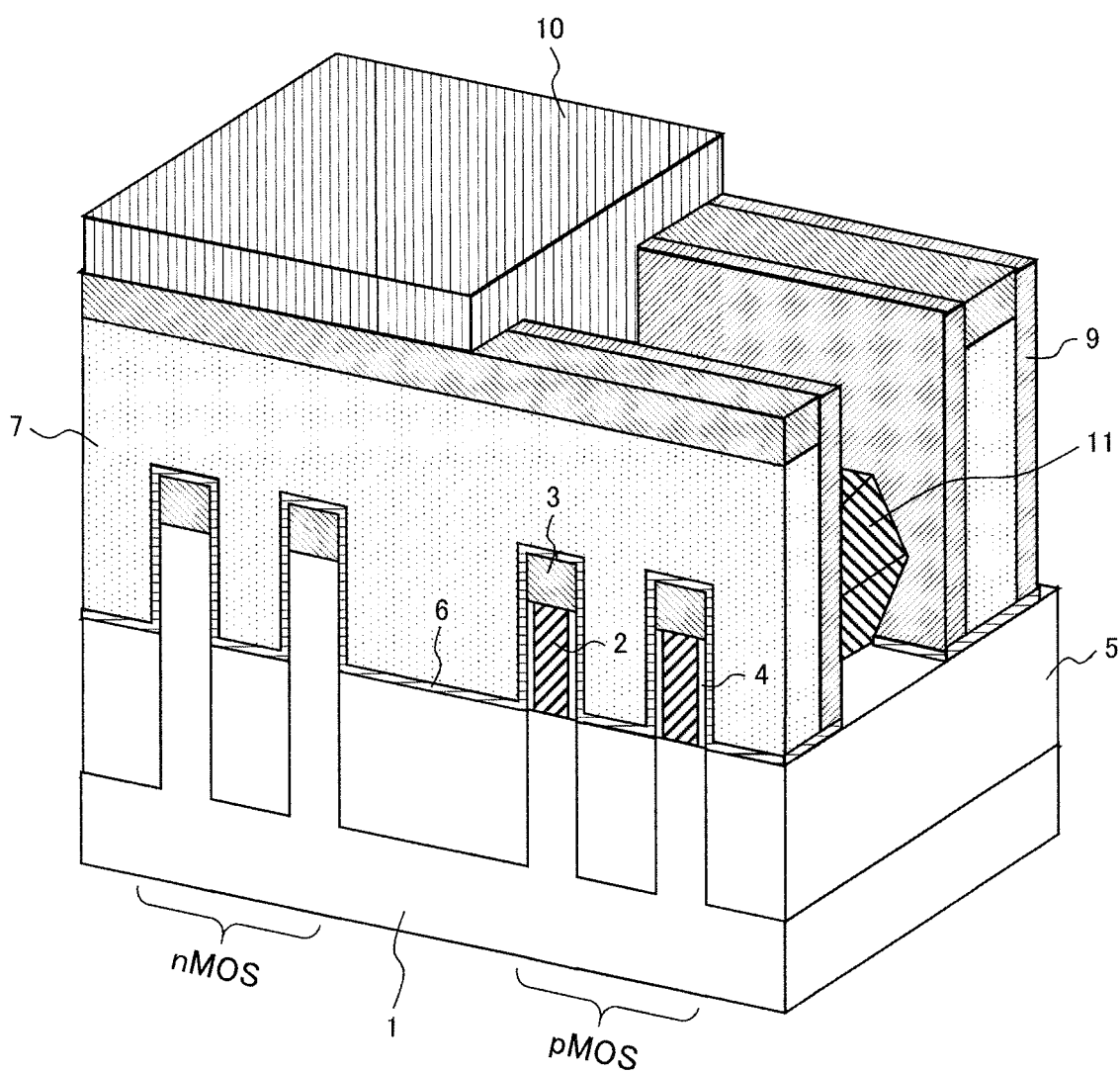
FIG. 5F is a bird's-eye view of a manufacturing process of the semiconductor device including the SiGe channel according to Embodiment 1.

Subsequently, for each fin, a p type SiGe source/drain 11 is epitaxially grown on a selective basis in distinction from surrounding insulating films in such a way that the surface of each fin exposed on the surface of the STI insulating film 5 and the SiGe layer 2 exposed on the sidewall of the gate sidewall insulating film 9 are covered with the p type SiGe source/drain 11, so that a structure shown in FIG. 5F is obtained. It is preferable that the epitaxial growth should be executed using a CVD apparatus, and for example, hydrogen-diluted monosilane ($SiH_4$), disilane ($Si_2H_6$), or germanium tetrahydride ($GeH_4$) is used as source gas, and diborane ($B_2H_6$) is used as doping gas. In addition, the epitaxial growth is executed in a hydrogen gas atmosphere, and in order to improve the selectivity, hydrogen chloride (HCl) gas is added to the hydrogen gas atmosphere as needed.

Next, the etching of the laminated body and the source/drain formation by executing the epitaxial growth, in the source/drain region in the p type MOSFET region, which are explained in FIG. 5E and FIG. 5F, is also executed in the n type MOSFET region. In this case, the p type MOSFET region is covered with a hard mask in the same way, the hard masks 3 and the Si fins in the source/drain region of the n type MOSFET are removed by etching, and an n type Si source/drain is epitaxially grown on a selective basis in distinction from surrounding insulating films. It is preferable that the epitaxial growth should be executed using a CVD apparatus, and for example, hydrogen-diluted $SiH_4$ or $Si_2H_6$ is used as source gas, and hydrogen-diluted phosphine ($PH_3$) or hydrogen-diluted arsine ($AsH_3$) is used as doping gas. Furthermore, the epitaxial growth is executed in a hydrogen gas atmosphere, and in order to improve the selectivity, HCl is added to the hydrogen gas atmosphere as needed.

Figure 5G:
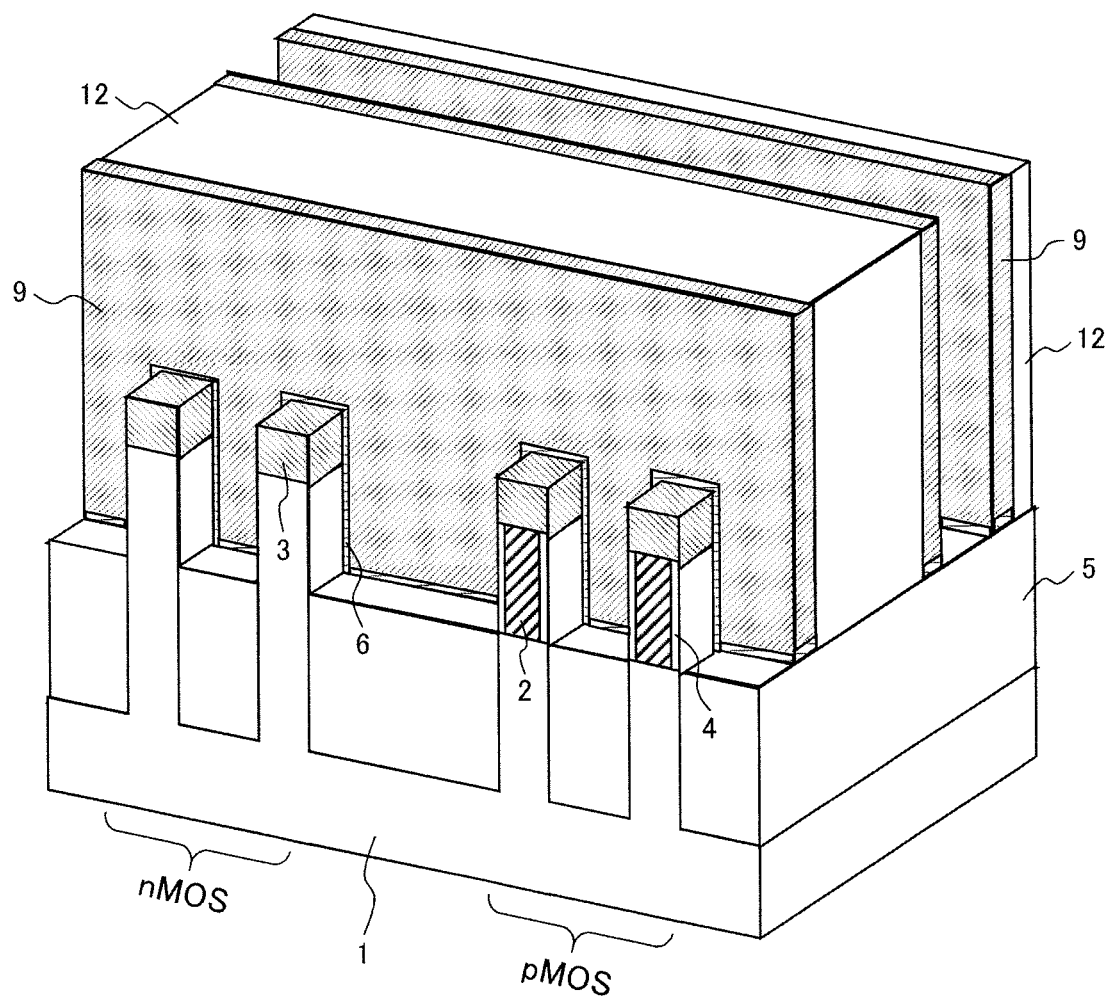
FIG. 5G is a bird's-eye view of a manufacturing process of the semiconductor device including the SiGe channel according to Embodiment 1.

Next, inter-layer insulating films 12 are deposited so that the source/drain region is filled with the inter-layer insulating films 12, and after the surfaces of the inter-layer insulating films 12 are flattened by carrying out CMP, the hard masks 8 on the dummy gates 7, the dummy gates 7, and the dummy gate insulating films 6 are removed by etching in this order, so that a structure shown in FIG. 5G is obtained. Here, the etching conditions on the hard masks 8 on the dummy gates 7, the dummy gates 7, and the dummy gate insulating film 6 are executed under the above-described selective etching conditions according to the materials of the hard masks 8, the dummy gates 7, and the dummy gate insulating films 6 respectively. When the dummy gates 7 and the dummy gate insulating films 6 are etched, the hard masks 3 on the fins works as the passivation films for the fin channels.

Figure 5H:
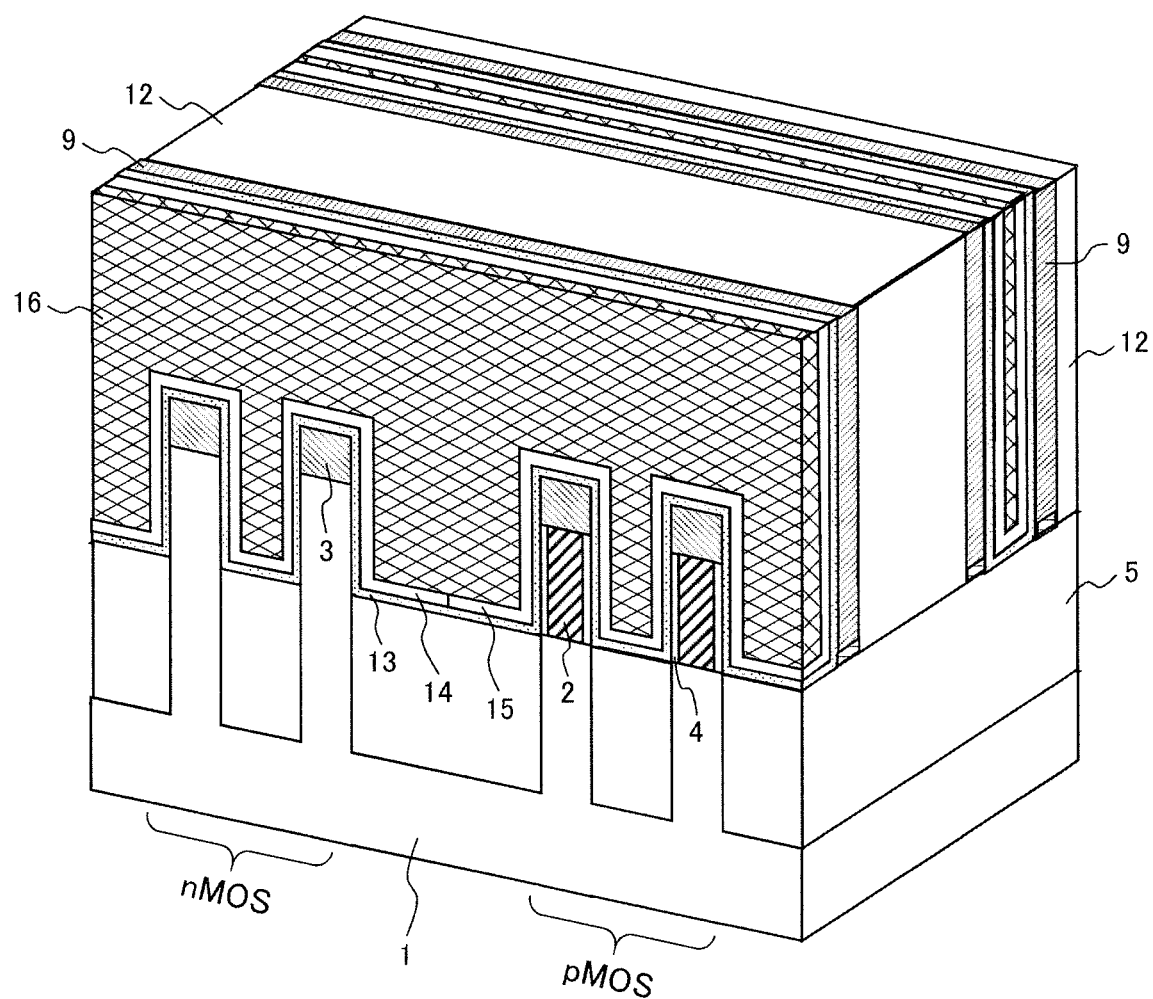
FIG. 5H is a bird's-eye view of a manufacturing process of the semiconductor device including the SiGe channel according to Embodiment 1.

Next, a gate insulating film 13, an n type work function metal (WFM) 14 or a p type WFM 15 is deposited on the structure shown in FIG. 5G, and after a gate metal 16 is further deposited, the surfaces of the gate insulating film 13, the n type WFM 14 or the p type WFM 15, and the gate metal 16 are flattened by carrying out CMP, so that a structure shown in FIG. 5H are obtained. The n type WFM 14 and the p type WFM 15 are separately formed in the n type MOSFET region and the p type MOSFET region respectively. This separation between the n type WFM 14 and the p type WFM 15 can be carried out, for example, as follows. First, after the n type WFM 14 is formed, the n type WFM 14 is mask-patterned, and part of the n type WFM 14 in the p type MOSFET region is removed. Next, after the p type WFM 15 is formed overall, the p type WFM 15 is mask-patterned, and part of the p type WFM 15 in the n type MOSFET region is removed. When the n type WFM 14 and the p type WFM 15 are etched, the hard masks 3 on the fins also works as the passivation films for the fin channels.

It is preferable that the gate insulating film 13 should be made of a high dielectric material such as hafnium oxide ($HfO_2$) and aluminum oxide ($Al_2O_3$), or a laminated film made of these high dielectric materials in order to enhance the controllability of the operation of the transistor using the gate. Furthermore, it is also effective for improving the characteristic of the gate insulating film to add a metal material such as zirconium (Zr), lanthanum (La), or yttrium (Y) to these high dielectric materials. In addition, it is also conceivable that, before the formation of the gate insulating film 13, thin oxide ($SiO_2$) films are formed on the Si surfaces of the fin channels using thermal oxidation or plasma oxidation. By interposing an ultrathin (about 1 nm or less) SiO2 film at an interface between a high dielectric material and a Si channel or a SiGe channel with a Si segregation layer, it becomes possible to improve the characteristic of the interface more efficiently.

Metal wirings to connect the gates and sources/drains formed on the structure shown in FIG. 5H, so that a logical integrated circuit having a CMOS transistor can be formed.

Figure 6:
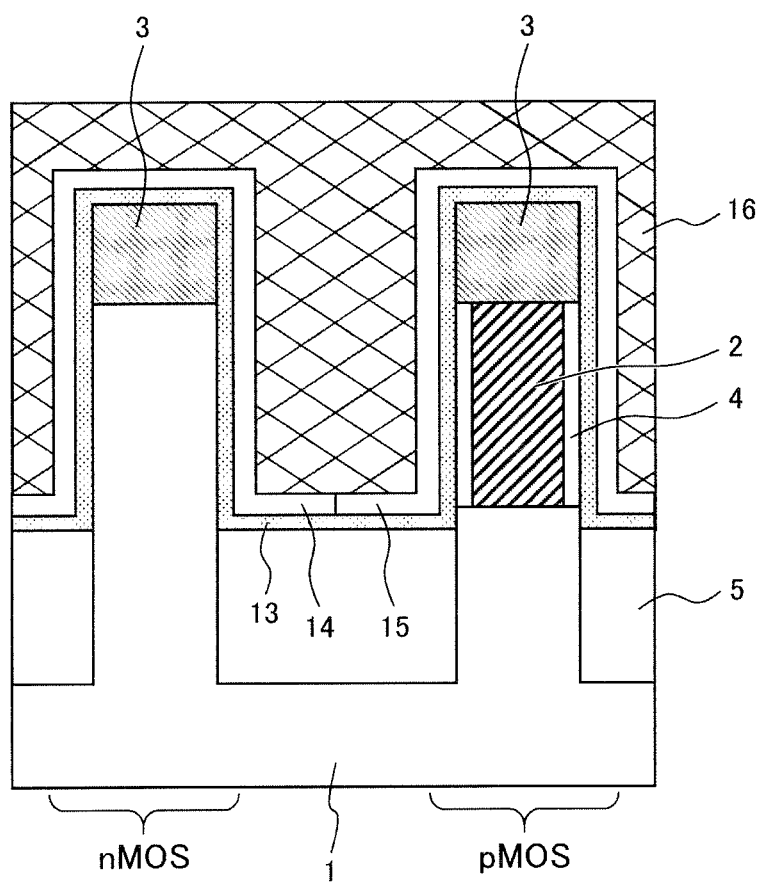
FIG. 6 is a cross-sectional view of the semiconductor device including the SiGe channel according to Embodiment 1.

The cross-sectional view perpendicular to the fins of the structure shown in FIG. 5H is shown in FIG. 6. In this case, only one fin is shown for each of the n type MOSFET and the P type MOSFET for simplicity. The SiGe channel 2 and the gate insulating film 13 are separated from each other by the Si segregation layer 4, so that the occurrence of a leakage current and the formation of a SiGe/gate insulating film interface that induces carrier traps are suppressed.

Figure 7:
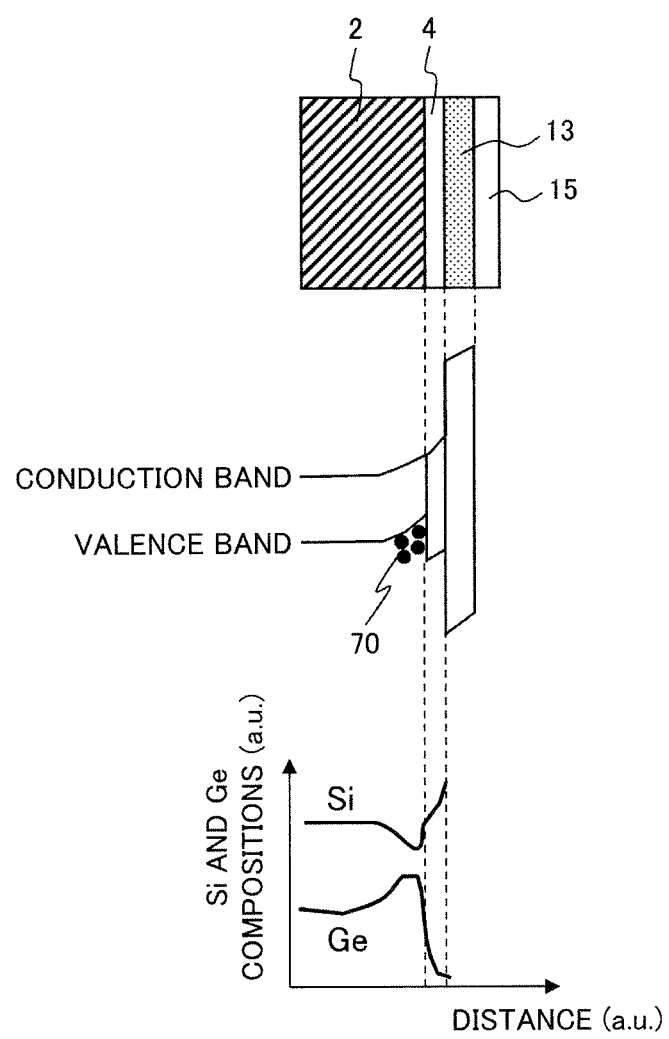
FIG. 7 is a diagram for explaining an effect a Si segregation layer gives on the characteristic of a transistor.

FIG. 7 shows an effect the Si segregation layer 4 gives on the characteristics of the MOSFET. FIG. 7 shows a laminated film in the vicinity of the interface between the channel and the gate of a FinFET having a SiGe channel, a band structure corresponding to the laminated film, and Si and Ge compositions in the channel. The band structure shown in FIG. 7 shows a condition in which the p type MOSFET is active, that is, a state in which a minus voltage is applied to the p type WFM 15, which causes the bends of bands in the SiGe channel 2 and the Si segregation layer 4 in the vicinity of the gate insulating film 13. As shown in FIG. 7, holes 70, which are carriers, are accumulated in the vicinity of an interface between the SiGe channel 2 and the Si segregation layer 4 owing to this bends of the bands. Here, the Si segregation layer 4 has a wider band gap than the SiGe channel 2 has, so that there is band discontinuity (offset) of about 20 meV between the SiGe channel 2 and the Si segregation layer 4 in the valence band. This band offset plays a role of detaching the holes 70 from an interface between the SiGe channel 2 and the gate insulating film 13.

With this, an influence on the characteristic of the MOSFET brought about by the channel/gate insulating film interface can be suppressed more effectively. Furthermore, since it is possible that the thickness of the Si segregation layer 4 can be adjusted to be less than 1 nm in this embodiment, it is avoidable that the Si segregation layer 4 itself works as a channel owing to the entrance of holes into the Si segregation layer 4, so that the Si segregation layer 4 plays only a role of a barrier film. In addition, since the Si segregation phenomenon is brought about by the replacement of Ge atoms with Si atoms in the SiGe layer, it is expected that Ge composition will locally increase in the vicinity of the interface between the SiGe channel 2 and the Si segregation layer 4 under the influence of the replacement phenomenon. Since Ge composition in a region of the SiGe channel 2 where holes 70 are accumulated is higher than Ge composition in the channel, further increase of mobility can be expected.

As described above, the process of a channel having a fin structure and the formation of an ultrathin film Si segregation layer on the surface of the SiGe channel are carried out in a continuing combination of processes in the same apparatus, so that a good channel/gate insulating film interface can be formed without causing damage to the SiGe channel. With this, both increase of an off-current and degradation of an on-current owing to the state of the channel/gate insulating interface can be suppressed, and a semiconductor device that can realize both high on-current and low off-current can be fabricated.

Embodiment 2

Figure 8:
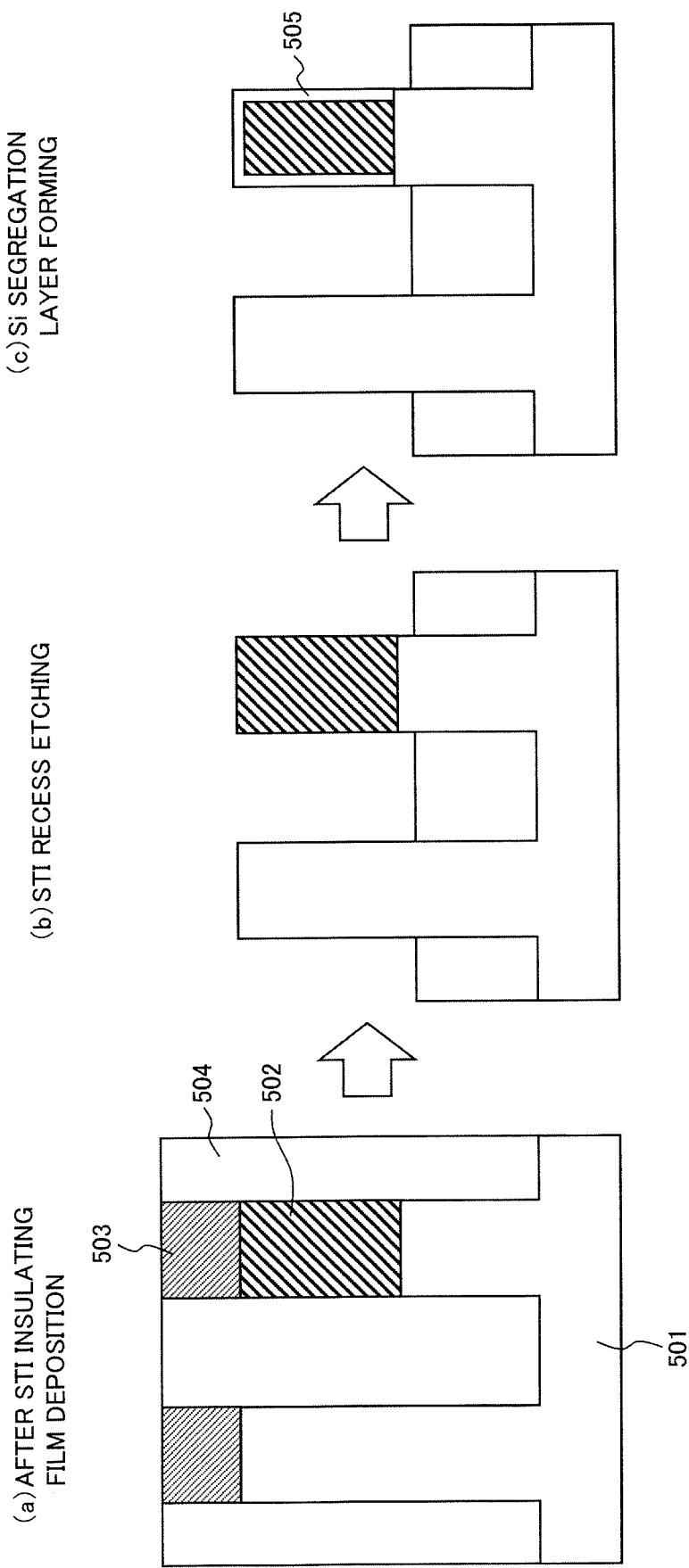
FIG. 8 are diagrams showing the channel forming method of a semiconductor device including a SiGe channel according to Embodiment 2.

Hereinafter, although a semiconductor device having a silicon germanium (SiGe) channel according to Embodiment 2 and a manufacturing method thereof will be explained, mainly differences from Embodiment 1 will be explained, and redundant explanations will be omitted. FIG. 8 show the channel forming method of a semiconductor device according to Embodiment 2. The formation timing of a Si segregation layer in this embodiment is different from the formation timing in Embodiment 1. FIG. 8(*a*) is a cross-sectional view of a structure obtained in such a way that, after a fin structure shown in FIG. 1(*b*) is formed, an STI insulating film is deposited without forming a Si segregation layer for a SiGe channel, and then a flattening process is executed using CMP. A Si fin is formed in an n type MOSFET region of a Si substrate 501, and a fin (SiGe fin), which is made by replacing a Si layer in the upper region of another Si fin with a SiGe layer 502, is formed in a p type MOSFET region of the Si substrate 501. This fin structure and hard masks 503, which work as masks when an etching process is executed on the fin structure, are covered with an STI insulating film 504. First, etching is executed on the hard masks 503 in the structure shown in FIG. 8(*a*), and successively etching back is executed on the STI insulating films 504 using anisotropic etching to form an element isolation region, so that a structure shown in FIG. 8(*b*) is obtained. In this case, although the surface of the STI insulating film 504 after these etchings is set lower than the bottom surface of the SiGe channel 502 by several nm, the heights of both surfaces may be set the same. In the wake of these etching processes, hydrogen plasma processing is performed in the same chamber of a plasma apparatus where the above etchings are executed to induce a Si segregation phenomenon, so that an ultrathin film Si segregation layer 505 is formed on the surface of the SiGe channel 502, and a structure shown in FIG. 8(*c*) is obtained.

In Embodiment 2, the hard masks 503 in the upper parts of the fins are removed, so that both the sidewalls and the top parts of fin type channels are covered with a gate when a MOSFET process is completed. With this, the controllability of the gate in the structure of Embodiment 2 that is stronger than that of Embodiment 1 can be obtained.

Figure 9:
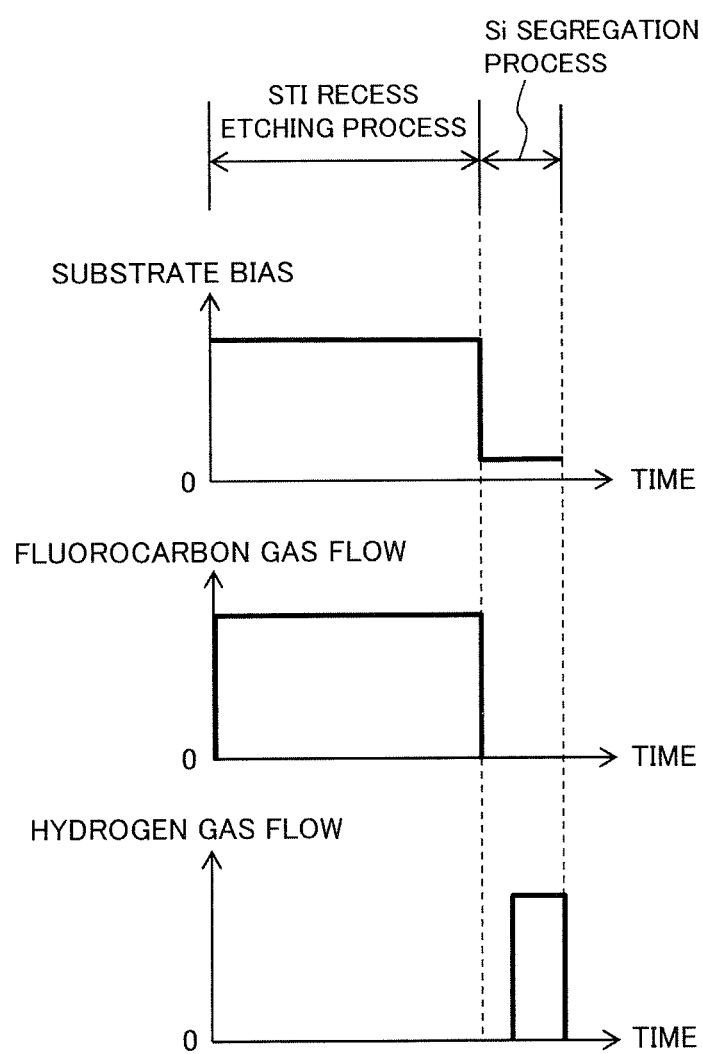
FIG. 9 is a diagram showing the processing conditions of a plasma processing apparatus according to Embodiment 2.

FIG. 9 shows the processing conditions of a plasma processing apparatus used in these sequential processes. In the etching of the hard masks 503, gas capable of executing etching the hard masks with high selectivity in distinction from the STI insulating film 504, the surface of the Si fin, and the surface of the SiGe fin in accordance with the material of the hard masks is selected. For example, in the case where $SiN_4$ is used for the material of the hard masks 503, the usage of mixed gas of fluorocarbon-based gas such as $CF_4$ and oxygen gas to which $Cl_2$ or the like is added makes it possible to keep an etching selective ratio of the hard masks 503 to other materials high. In the following etching of the STI insulating film 504, for example, if $SiO_2$ is used for the material of the STI insulating film 504, the usage of fluorocarbon-based gas such as $CF_4$ or $CHF_3$ makes it possible to keep an etching selective ratio to the Si fins and the SiGe fins high. The etching used for the hard masks 503 and the STI insulating film 504 is anisotropic etching-based etching, and it is executed under a condition that a certain level of a high frequency bias is applied to the substrate. On the other hand, in $H_2$ plasma processing performed after the etch back of the STI insulating film 504, the level of the high frequency bias applied to the substrate is set lower than the level of the high frequency bias used for the above etching, or the $H_2$ plasma processing is performed under a condition that no high frequency bias is applied to the substrate, as is the case with Embodiment 1.

Here, although an example in which the STI insulating film 504 is deposited without forming the ultrathin film Si segregation layer 505 for the SiGe channel 502 is shown in FIG. 8, it is conceivable, as is the case with Embodiment 1, that, after the structure shown in FIG. 1(c) is formed by forming the ultrathin film Si segregation layer 505 for the SiGe channel 502, the STI insulating film 504 is deposited as shown in FIG. 8(a). In this case, after the STI insulating film 504 is etched back using anisotropic etching, the ultrathin film Si segregation layer 505 is again formed for the SiGe channel. This is because, in Embodiment 2, part of the SiGe layer 502 is exposed at the upper part of the SiGe fin owing to the removal of the hard masks 503. Therefore, it becomes necessary that the ultrathin film Si segregation layer formation process should be executed at least twice.

Figure 10:
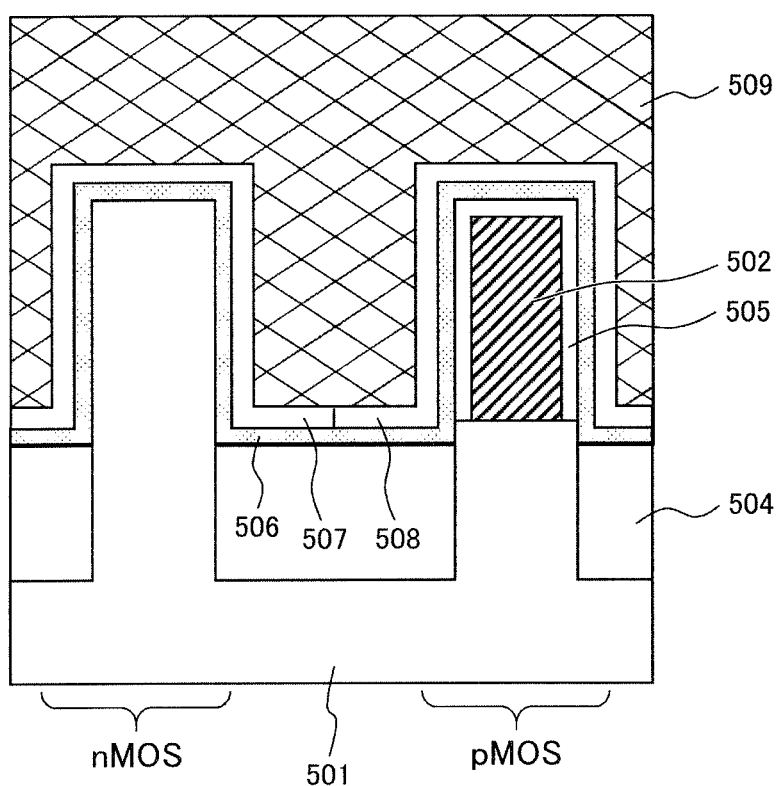
FIG. 10 is a cross-sectional view of the semiconductor device including the SiGe channel according to Embodiment 2.

A cross-sectional view perpendicular to the fins of the semiconductor device according to Embodiment 2 will be shown in FIG. 10. A gate insulating film 506, an n type WFM 507 or a p type WFM 508, and a gate metal 509 are deposited on the fin structure. The n type WFM 507 is formed in the n type MOSFET region, and the p type WFM 508 is formed in the p type MOSFET region, respectively. A MOSFET shown in FIG. 10 can be obtained by executing the processes, which are shown in FIG. 5C to FIG. 5H and explained in Embodiment 1, on the structure shown in FIG. 8(c).

In Embodiment 2, after the SiGe fin 502 is exposed, hydrogen plasma processing is performed on the SiGe fin 502, with the result that both sidewall and top of the SiGe fin 502 are covered with the ultrathin film Si segregation layer 505 having a uniform thickness. Since a Si segregation effect in this embodiment is a phenomenon occurring only in the vicinity of the surface, the thickness of the Si segregation layer 505 becomes almost constant independently of the plasma processing time. For the same reason, as is the case with the above, even in the case where the Si segregation layer is formed twice, that is, before and after the deposition of the STI insulating film 504 for the fin structure, the ultrathin film Si segregation layer 505 having a uniform thickness can be formed on both sidewall and upper portion of the SiGe fin 502.

As described above, both the side wall and the top of the fin type channels of a MOSFET shown in FIG. 10 are covered with a gate, so that the controllability of the gate of the MOSFET of Embodiment 2 that is better than that of the MOSFET of Embodiment 1 can be obtained.

Embodiment 3

Figure 11:
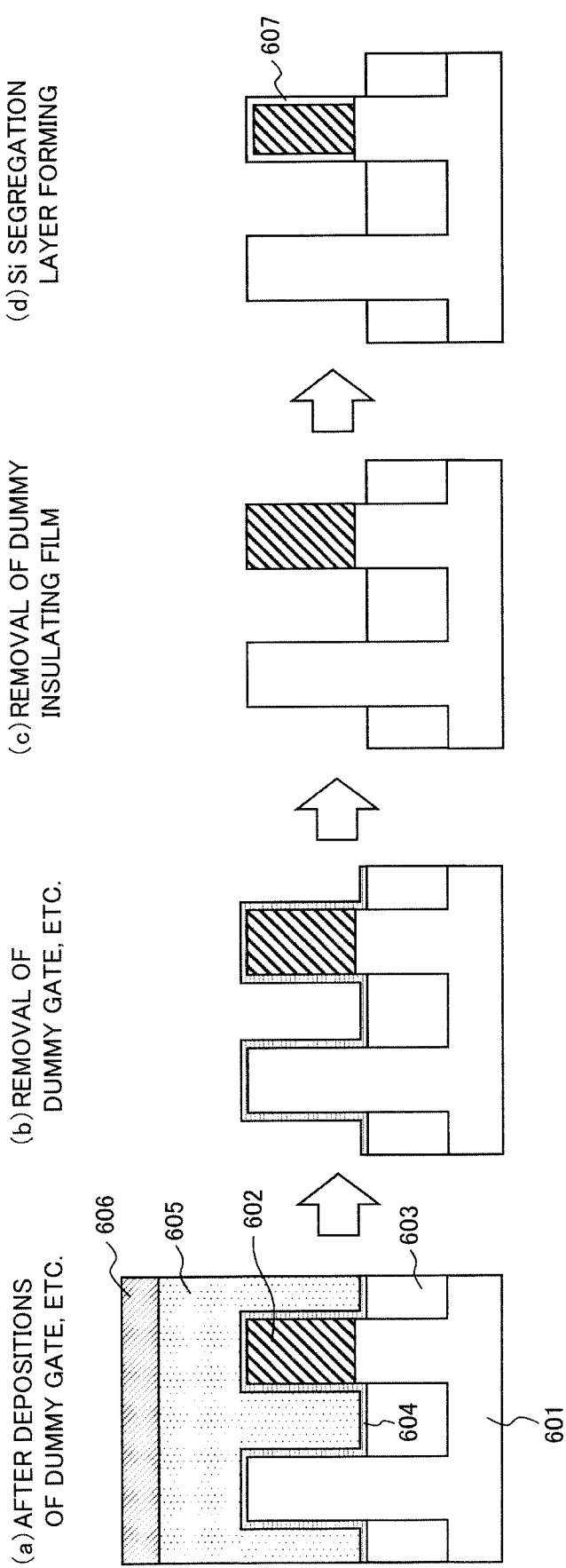
FIG. 11 are diagrams showing the channel forming method of a semiconductor device including a SiGe channel according to Embodiment 3.

Hereinafter, although a semiconductor device having a silicon germanium (SiGe) channel according to Embodiment 3 and a manufacturing method thereof will be explained, mainly differences from Embodiment 1 or Embodiment 2 will be explained, and redundant explanations will be omitted. FIG. 11 show the channel forming method of the semiconductor device according to Embodiment 3. The formation timing of a Si segregation layer in this embodiment is different from the forming timings in Embodiments 1 and 2. FIG. 11(a) shows a state in which a dummy gate insulating film 604, a dummy gate 605, and a hard mask 606, which are explained using FIG. 5C of Embodiment 1, are deposited on a structure shown in FIG. 8(B) of Embodiment 2 (the structure includes a Si fin and a SiGe fin including a SiGe layer 602 on a Si substrate 601).

After processes corresponding to FIG. 5C to FIG. 5F of Embodiment 1 are executed, a process corresponding to FIG. 5G is executed. A structure shown in FIG. 11(a) is put into a plasma processing apparatus, and the hard mask 606 and the dummy gate 605 are removed by etching, so that a structure shown in FIG. 11(b) is obtained. Successively, the dummy gate insulating film 604 is removed by etching in the same chamber of the same apparatus, so that a structure shown in FIG. 11(c) is obtained. Successively, hydrogen plasma processing is performed in the same chamber of the same apparatus, and an ultrathin film Si segregation layer 607 is formed on the surface of the SiGe channel 602 by inducing a Si segregation phenomenon, so that a structure shown in FIG. 11(d) is obtained. In Embodiment 3, just before the formation of a gate insulating film in a MOSFET (a process corresponding to FIG. 5H of Embodiment 1), the Si segregation layer 607 is formed on the SiGe channel 602, with the result that it becomes possible to alleviate damage that MOSFET manufacturing processes cause to the Si segregation layer on the SiGe channel 602 more effectively in comparison with Embodiments 1 and 2. However, as described above, even in Embodiments 1 and 2, it is possible to recover the Si segregation layer by repeating hydro plasma processing.

Figure 12:
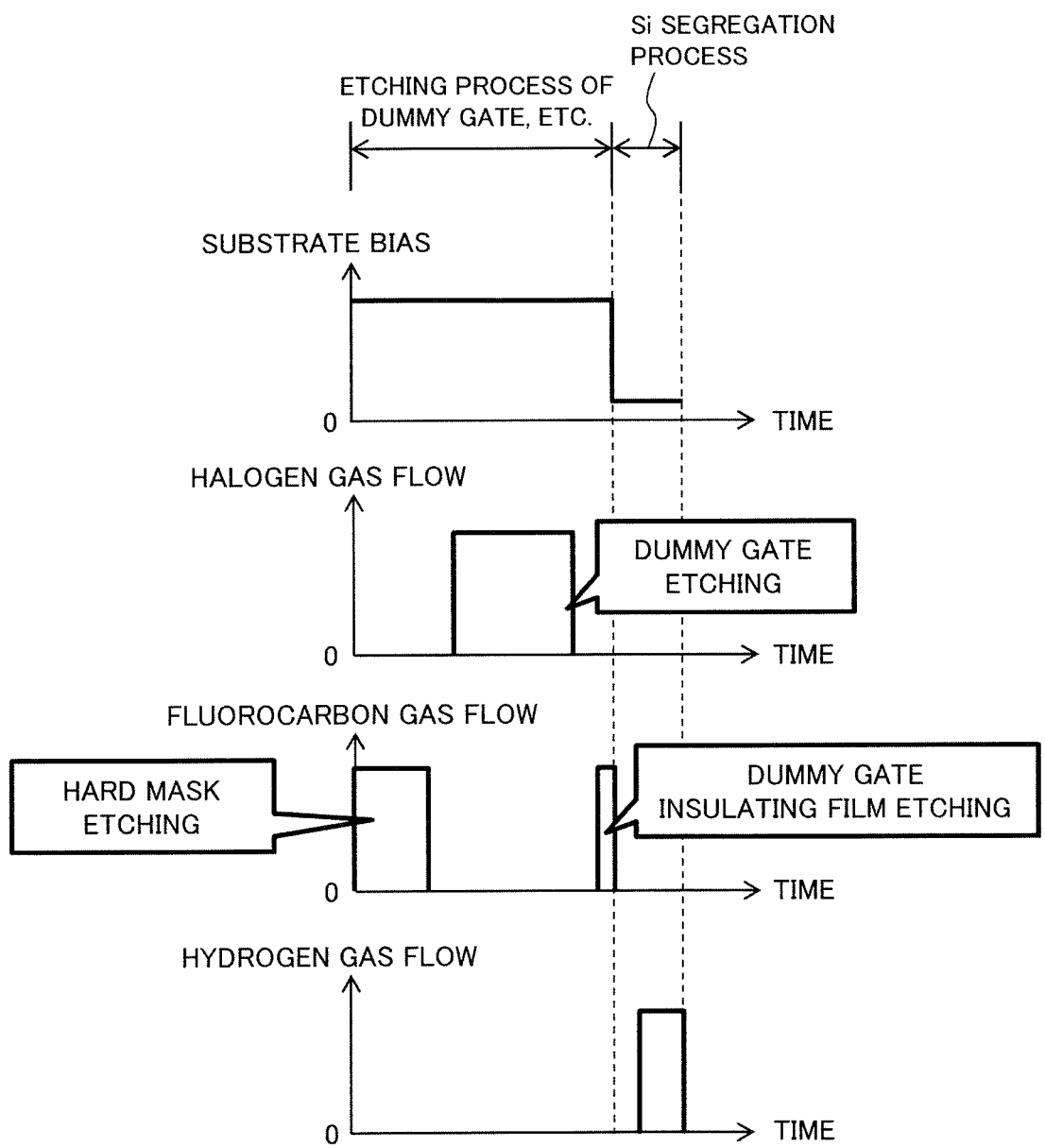
FIG. 12 is a diagram showing the processing conditions of a plasma processing apparatus according to Embodiment 3.

FIG. 12 shows the processing conditions of the plasma processing apparatus regarding the sequential processes shown in FIG. 11. In the etching of the hard mask 606 on the dummy gate, etching gas is selected in accordance with the material of the hard mask and neighboring materials. In other words, in the case where $Si_3N_4$ is used as the material of the hard masks 606, etching having a high selection ratio of the hard masks 606 to other materials can be executed by using mixed gas of fluorocarbon-based gas such as $CF_4$ and oxygen to which $Cl_2$ or the like is added. In the case of the etching of the dummy gate 605, selective etching for selecting amorphous Si or polycrystalline Si, in which the base dummy gate insulating film 604 is used as a stopper, becomes executable by using halogen-based gas such as $Cl_2$ or HBr. In the etching of the dummy gate insulating film 604 to be successively executed, fluorocarbon-based gas such as $CF_4$ or $CHF_4$ is used. Since a certain level of perpendicularity is required for the sequential etchings of the hard mask 606, the dummy gate 605, and the dummy gate insulating film 604, a necessary high frequency bias is applied to the substrate. On the other hand, since an object of the hydrogen plasma processing is to uniformly form the ultrathin film Si segregation layer 607, the hydrogen plasma processing is processed under a condition that the magnitude of the high frequency bias applied to the substrate is set lower than in the case of executing the etching or no high frequency bias is applied to the substrate, as are the cases with Embodiments 1 and 2.

The structure of the MOSFET of Embodiment 3 is almost the same as that of Embodiment 2, and a cross-sectional view, which is perpendicular to the fins, at the gate portion is the same as that shown in FIG. 10.

Embodiment 4

Figure 13A:
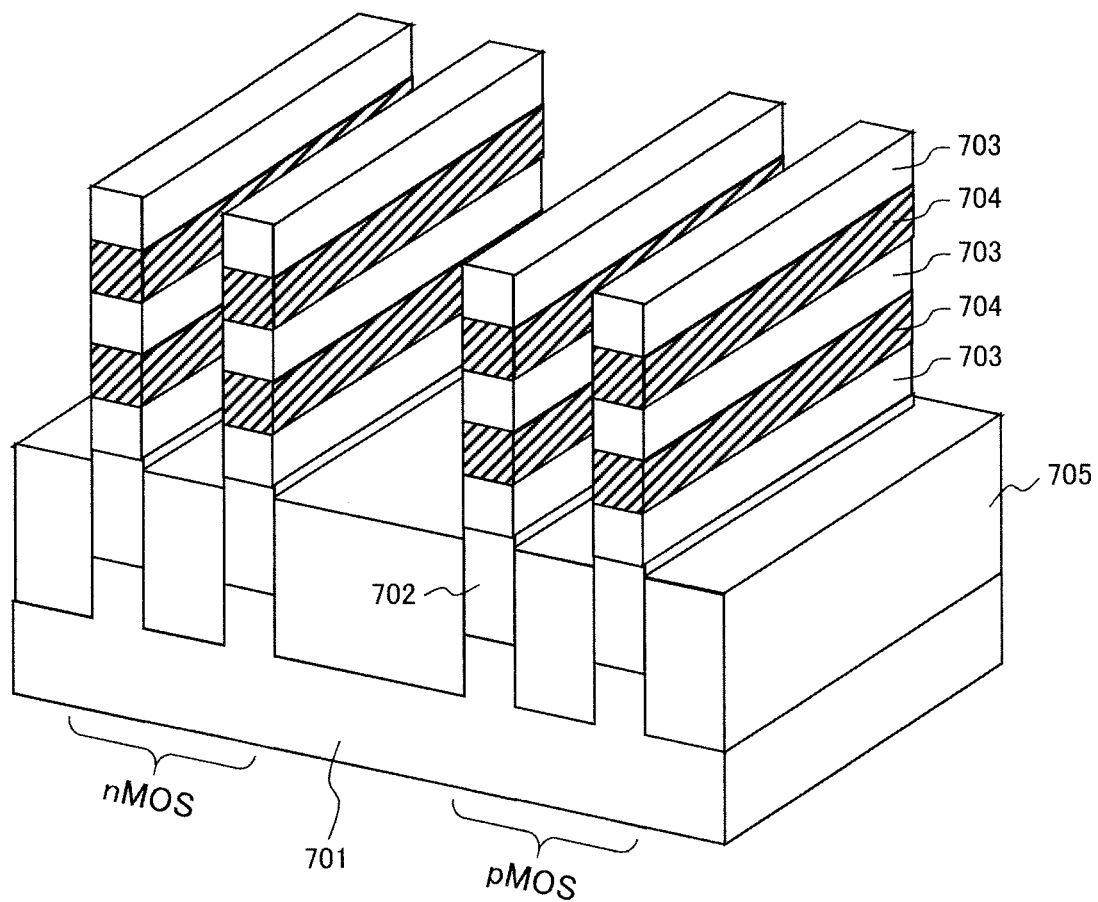
FIG. 13A is a bird's-eye view of a manufacturing process of a semiconductor device including a SiGe channel according to Embodiment 4.

A semiconductor device having a silicon germanium (SiGe) channel according to Embodiment 4 has a gate all around structure (GAA type FET) in which the entirety of the periphery of the channel is covered with a gate. In the following descriptions, mainly differences from Embodiment 1 to Embodiment 3 will be explained, and redundant explanations will be omitted. FIG. 13A shows a structure including: a Si substrate 701; an epitaxial growth layers 702 that are made of monocrystal Si or strain-relaxed monocrystal SiGe and formed on the Si substrate 701; fins each of which is composed of a laminated film including alternately-laminated plural monocrystal Si layers 703 and plural monocrystal SiGe layers 704; and STI insulating films 705.

In a structure shown in FIG. 13A, the Si layers 702 or the strain-relaxed SiGe layers 702, and the laminated films including alternately-laminated the monocrystal Si layers 703 and the monocrystal SiGe layers 704 are formed in series on the Si substrate 701 by executing epitaxial growth using a CVD method or the like. The processing steps of a fin structure and the forming steps of the STI insulation film 705 are the same as in the cases of other embodiments. If the epitaxial growth layers 702 are Si layers, the Si layers 703 do not include strains, and only the SiGe layers 704 include compressive strains. In this case, it is preferable that the Ge composition ratio of the SiGe layers 704 should be adjusted to be within a range from 20% to 25%. On the other hand, the epitaxial growth layers 702 are the strain-relaxed SiGe layers, tensile strains are applied to the Si layers 703. Since it is desirable that compressive strains should be applied to the SiGe layers 704, it is preferable that the SiGe layers 704 should have higher Ge composition ratios than the strain-relaxed SiGe layers 702 have. For example, it is conceivable that the Ge composition ratios of the strain-relaxed SiGe layers 702 are adjusted to be within a range from 20% to 25%, and the Ge composition ratios of the strain-applied SiGe layers 704 are adjusted to be within a range from 30% to 60%. If tensile strains are applied, the mobilities of electrons in an n type MOSFET improve, and if compressive strains are applied, the mobilities of holes in a p type MOSFET improve. Therefore, in the case where the epitaxial growth layers 702 are set to strain-relaxed SiGe layers, the characteristic of the n type MOSFET can be expected to improve compared with the case where the epitaxial growth layers 702 are set to Si layers.

Here, in the case where the epitaxial growth layers 702 are set to strain-relaxed SiGe layers, it is necessary to make the film thicknesses of the SiGe layers equal to or larger than a critical film thickness, with which the strains of the SiGe layers start to be relaxed, at the time of executing the epitaxial growth, therefore the influences of defects caused by the strain relaxation need to be suppressed. Therefore, it is conceivable that the Ge composition ratios of the strain-relaxed SiGe layers are gradually increased in the execution of the epitaxial growth or buffer layers are made while being kept at a low temperature. On the other hand, the film thicknesses of the strained SiGe layers 704 and the film thicknesses of the strained Si layers 703 in the case where strain-relaxed SiGe layers are used as the epitaxial growth layers 702 should be equal to or smaller than the critical film thickness with which the strains of the SiGe layers start to be relaxed. Furthermore, the design of the thicknesses of each Si layer 703 and each SiGe layer 704 becomes important in view of the characteristics of a MOSFET, and, for example, if the gate length is within a range from 15 nm to 30 nm, it is preferable to set the film thicknesses of each Si layer 703 and each SiGe layer 704 to about 5 nm to 20 nm.

Figure 13B:
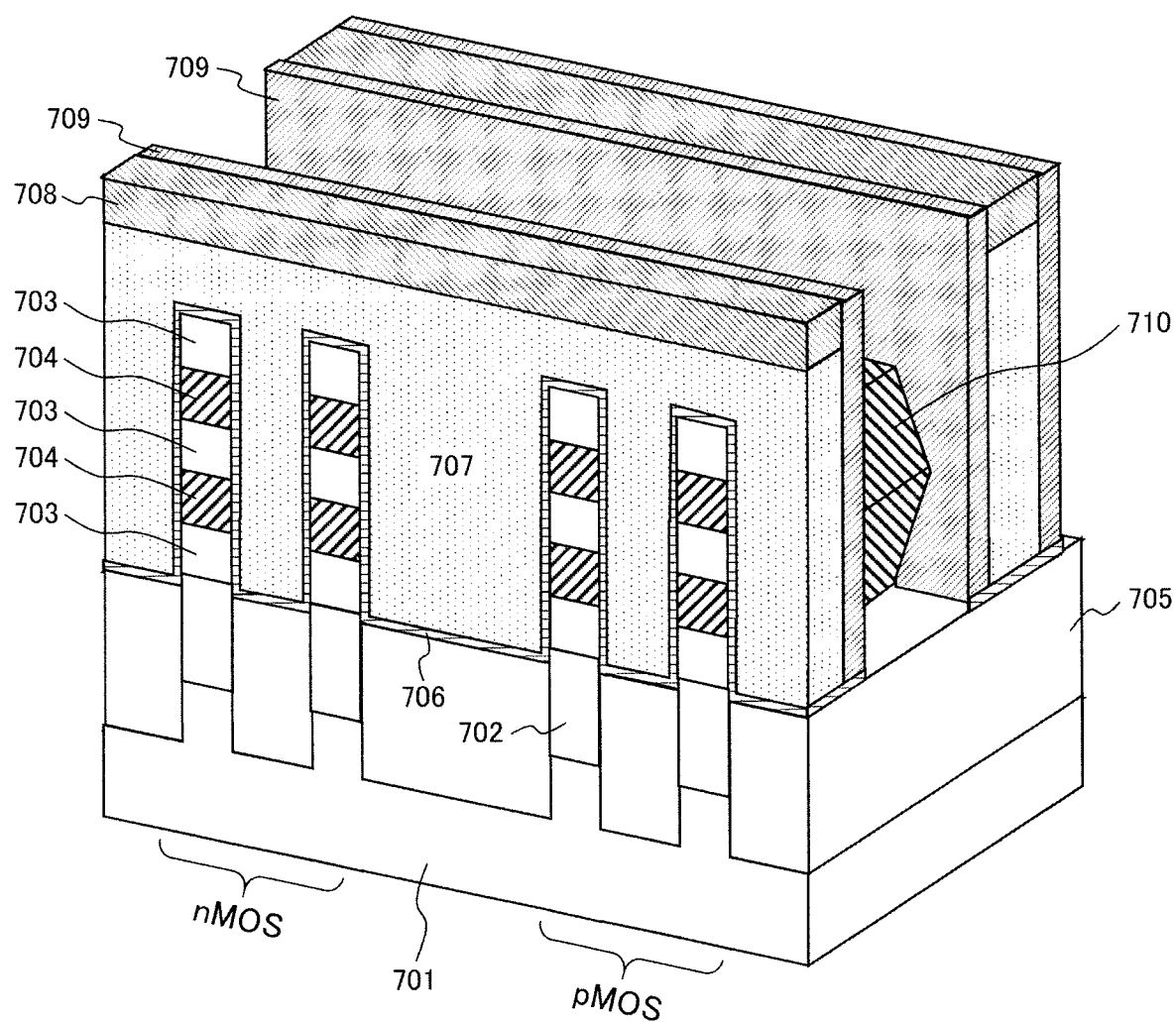
FIG. 13B is a bird's-eye view of a manufacturing process of the semiconductor device including the SiGe channel according to Embodiment 4.
Figure 14:
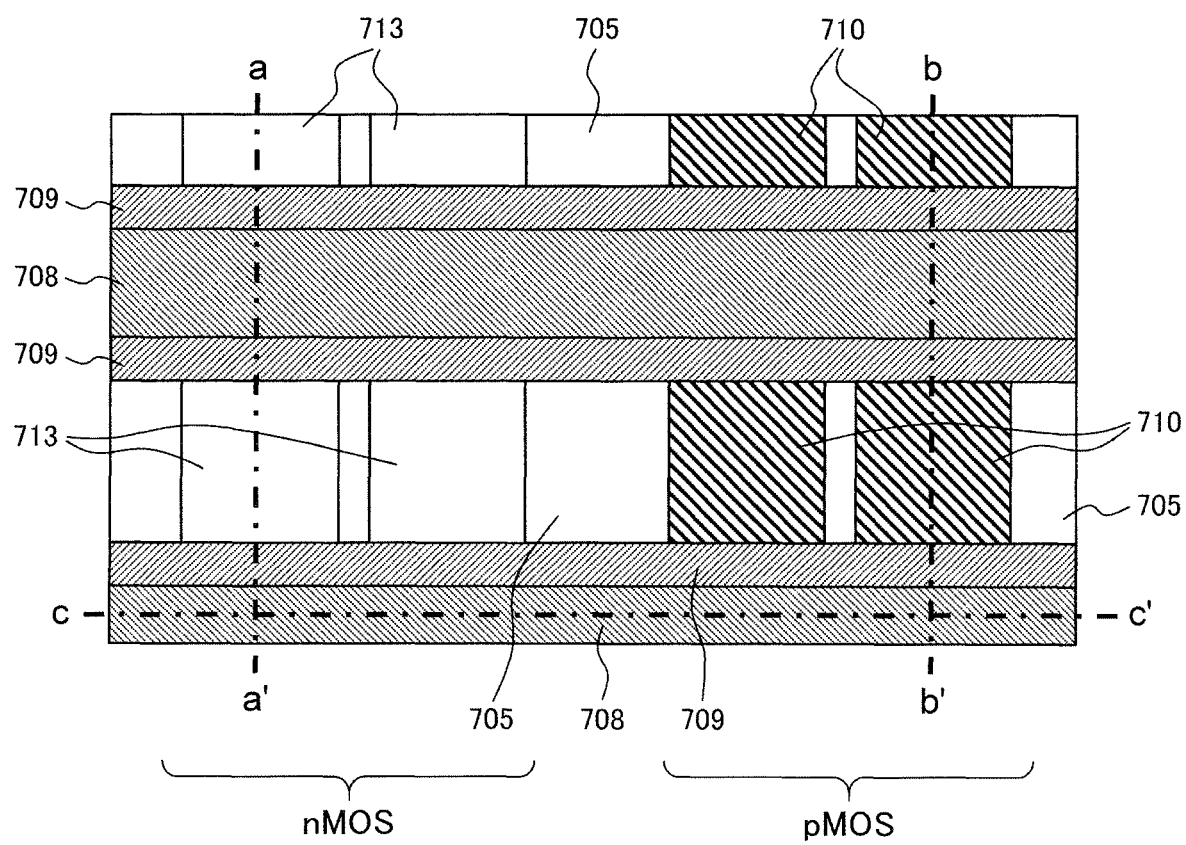
FIG. 14 is a plan view of the structure shown in FIG. 13B viewed from above.

After processes corresponding to FIG. 5B to FIG. 5F are executed on the structure shown in FIG. 13A, a structure shown by FIG. 13B is obtained. FIG. 14 shows the plan view of the structure shown in FIG. 13B that is viewed from above. Dummy gate insulating films 706, dummy gates 707, and hard masks 708 are formed on the fin structure made of the laminated films composed of the Si layers 703 and the SiGe layers 704, and dummy gate sidewall insulating films 709 are formed on the sidewalls of the dummy gates 707. In addition, epitaxially grown n type Si sources/drains 713 are formed in the source/drain region of the n type MOSFET, and epitaxially grown p type SiGe sources/drains 710 are formed in the source/drain region of the p type MOSFET.

Figure 13C:
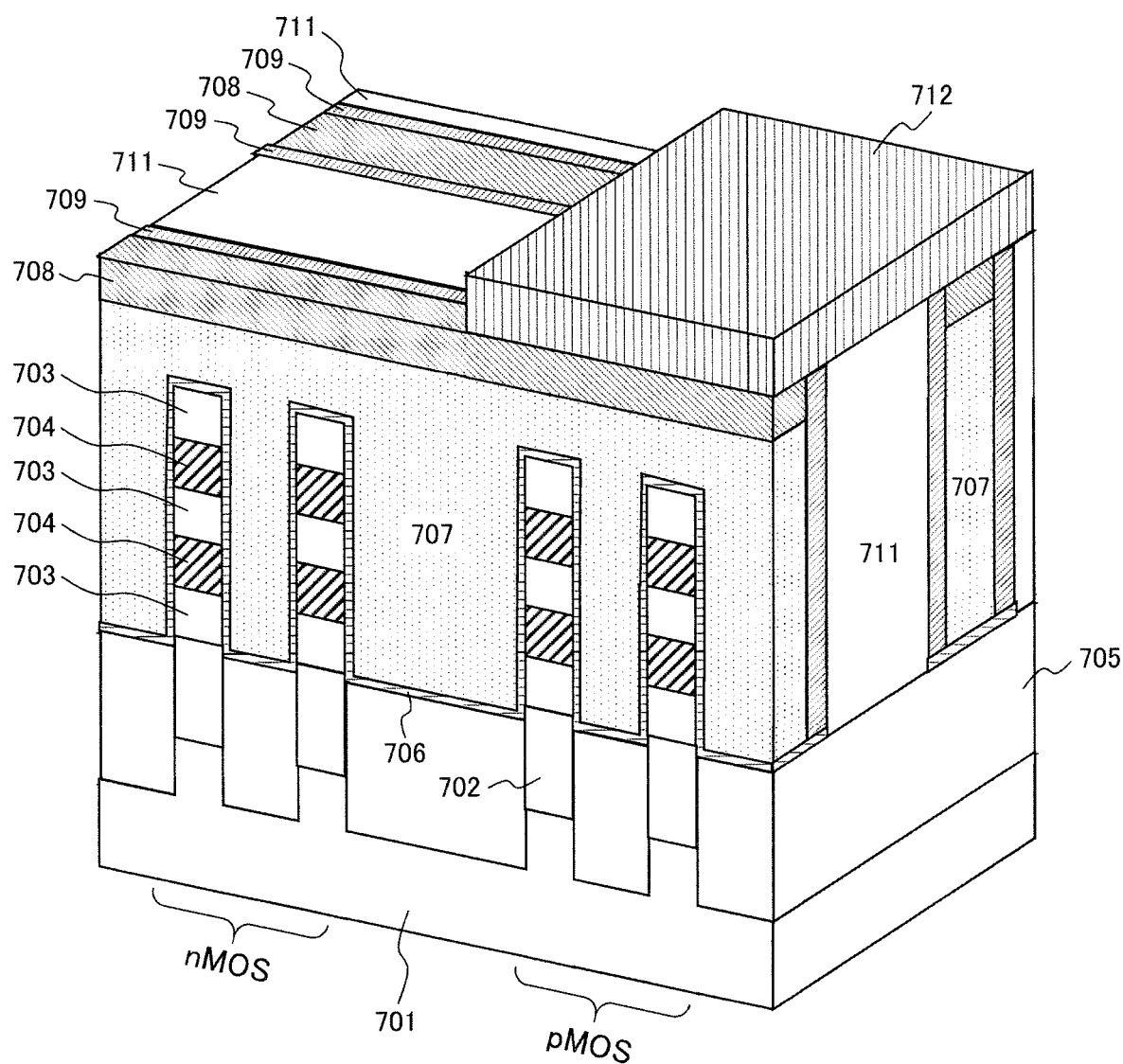
FIG. 13C is a bird's-eye view of a manufacturing process of the semiconductor device including the SiGe channel according to Embodiment 4.
Figure 15A:
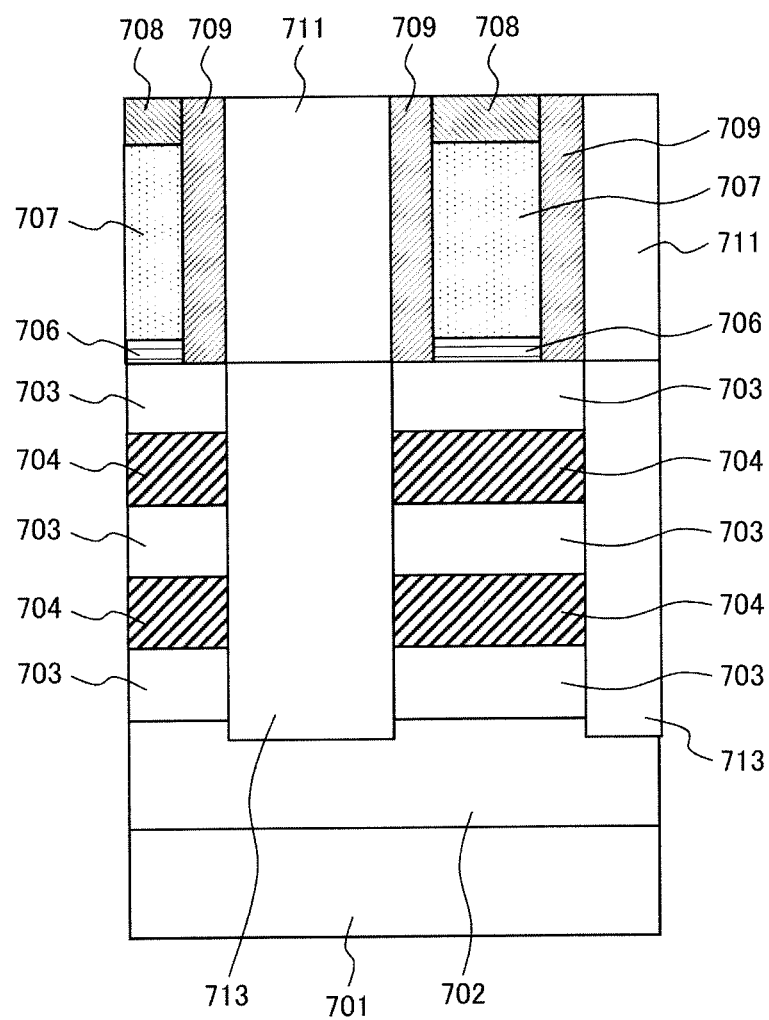
FIG. 15A is a cross-sectional view showing a manufacturing process of an n type MOSFET according to Embodiment 4.

Subsequently, after an inter-layer insulating film 711 is deposited on the entirety of the structure, a CMP flattening process is executed, and a p type MOSFET region is covered with a patterned resist 712, so that a structure shown in FIG. 13C is obtained. FIG. 15A shows a cross-sectional view of the structure shown in FIG. 13C along the line a-a' of FIG. 14, where the cross-sectional view is perpendicular to the gate of the n type MOSFET. In FIG. 15A, the sidewall of a laminated film composed of the Si layers 703 and the SiGe layers 704 on the cross-sectional view perpendicular to the gate is covered with an n type Si source/drain 713.

Figure 13D:
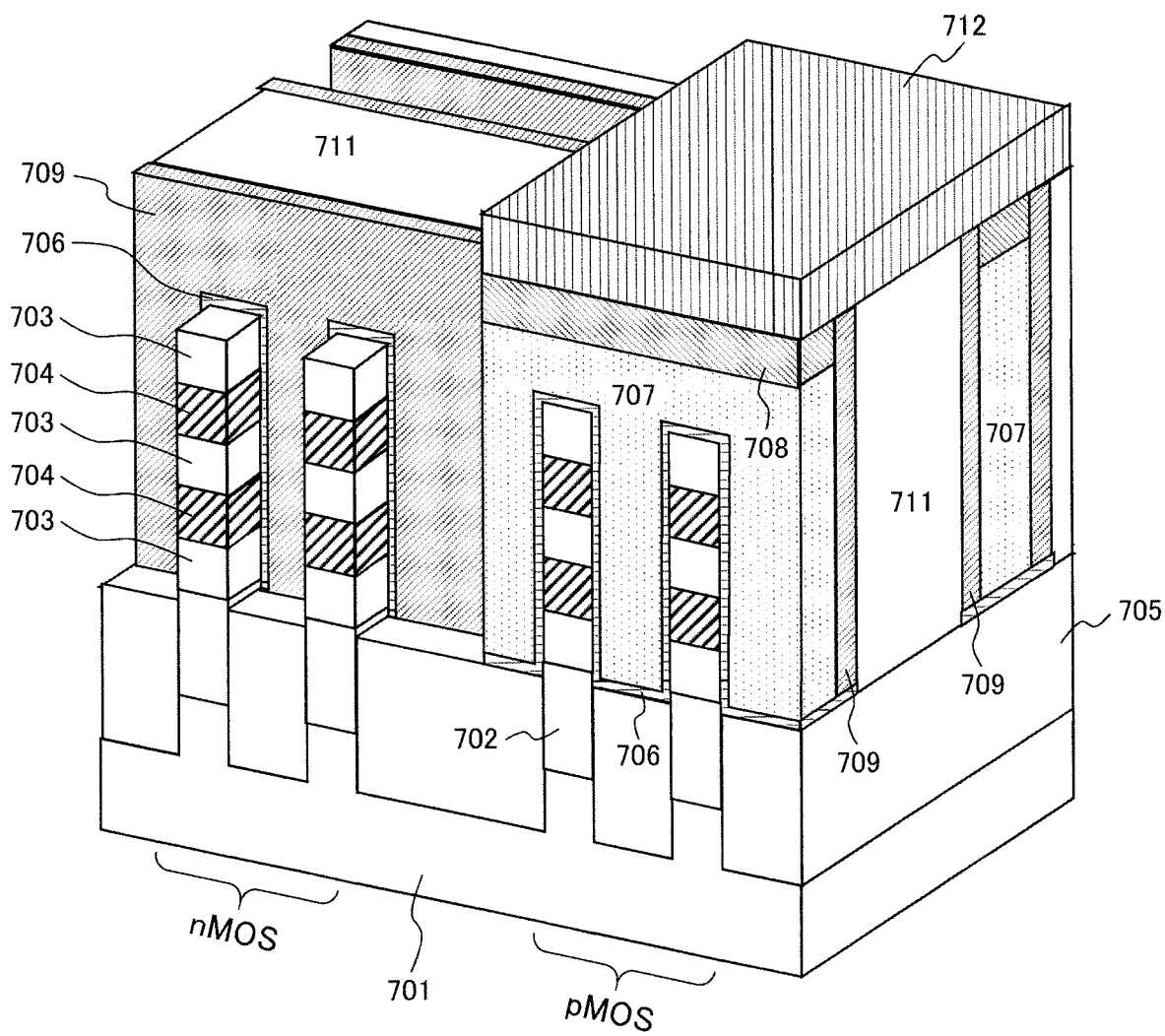
FIG. 13D is a bird's-eye view of a manufacturing process of the semiconductor device including the SiGe channel according to Embodiment 4.
Figure 15B:
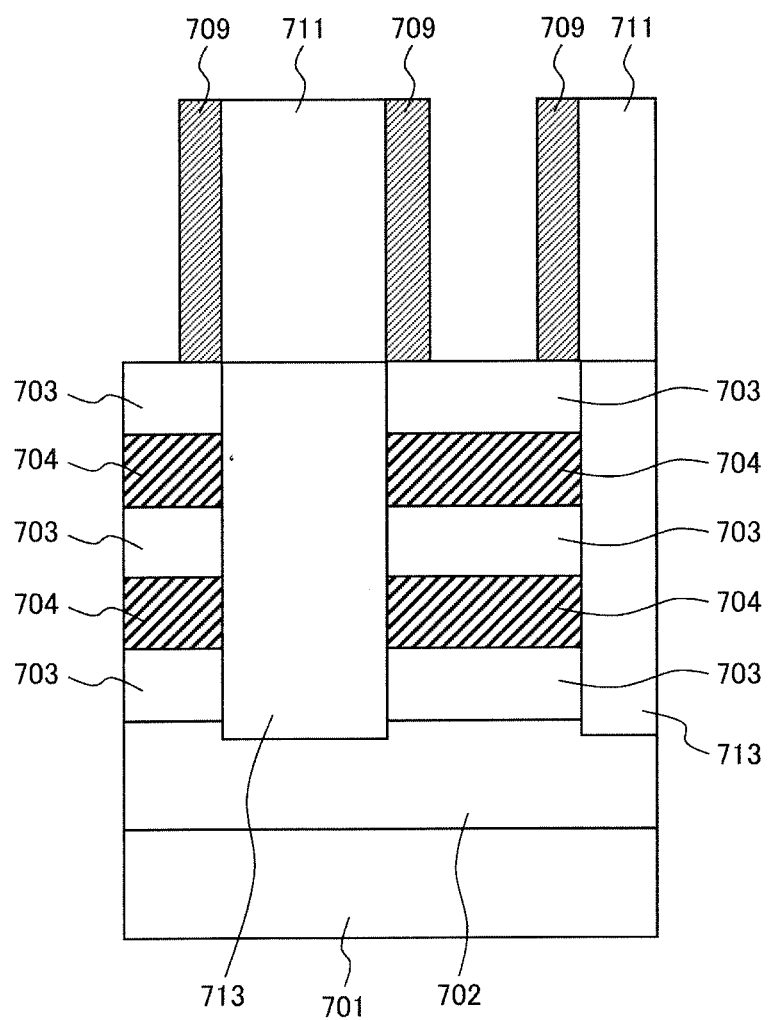
FIG. 15B is a cross-sectional view showing a manufacturing process of the n type MOSFET according to Embodiment 4.

Next, etching is carried out using the resist 712 as a mask, and the hard masks 708 on the dummy gates, the dummy gates 707, and the dummy gate insulating films 706 are sequentially removed by etching, so that a structure shown in FIG. 13D is obtained. In the wake of this etching, the fin structure made of the laminated films composed of the Si layers 703 and the SiGe layers 704 is exposed in the gate formation region of the n type MOSFET. FIG. 15B shows a cross-sectional view of the structure shown in FIG. 13D along the line a-a' of FIG. 14, where the cross-sectional view is perpendicular to the gate of the n type MOSFET.

Figure 13E:
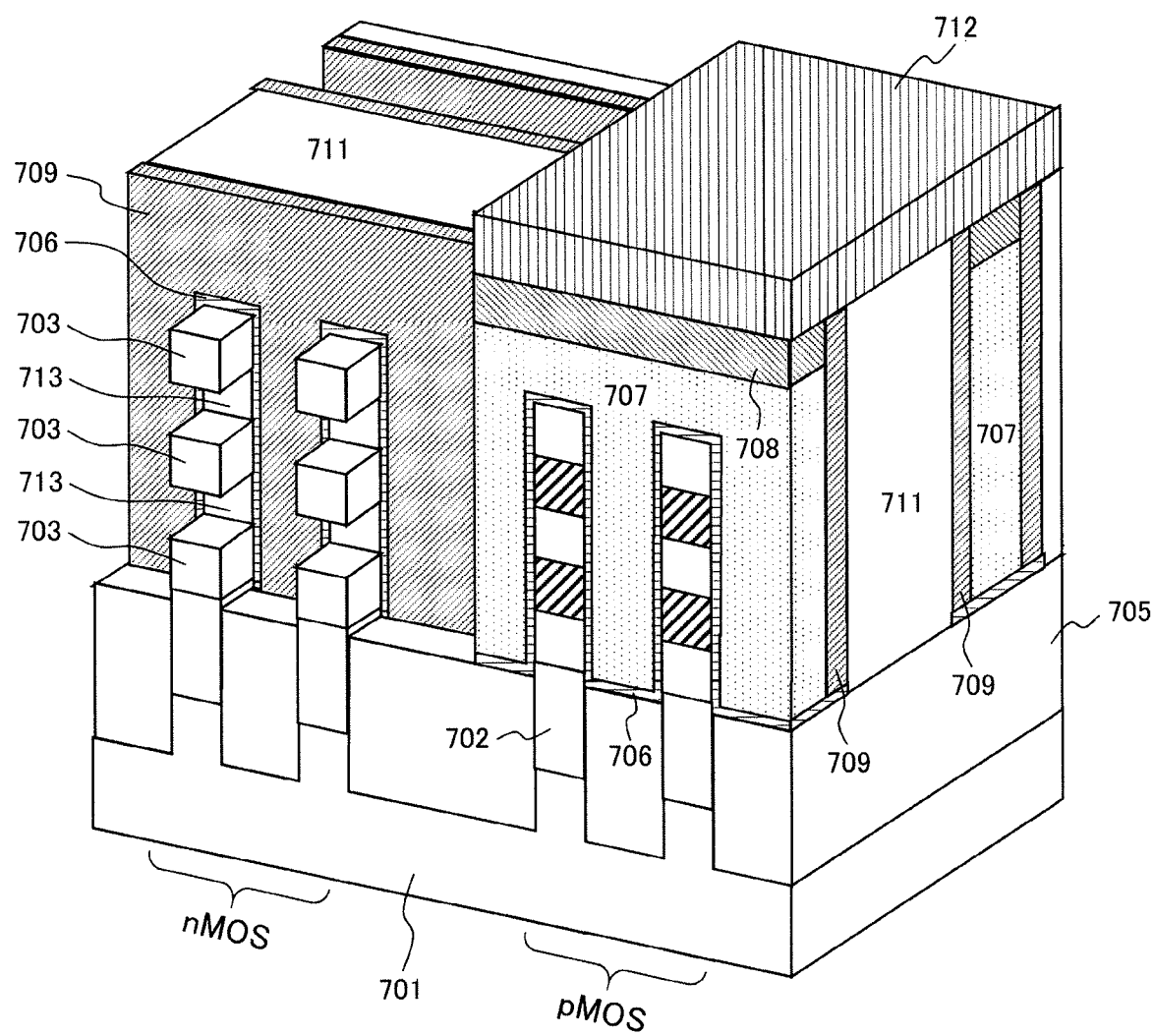
FIG. 13E is a bird's-eye view of a manufacturing process of the semiconductor device including the SiGe channel according to Embodiment 4.
Figure 15C:
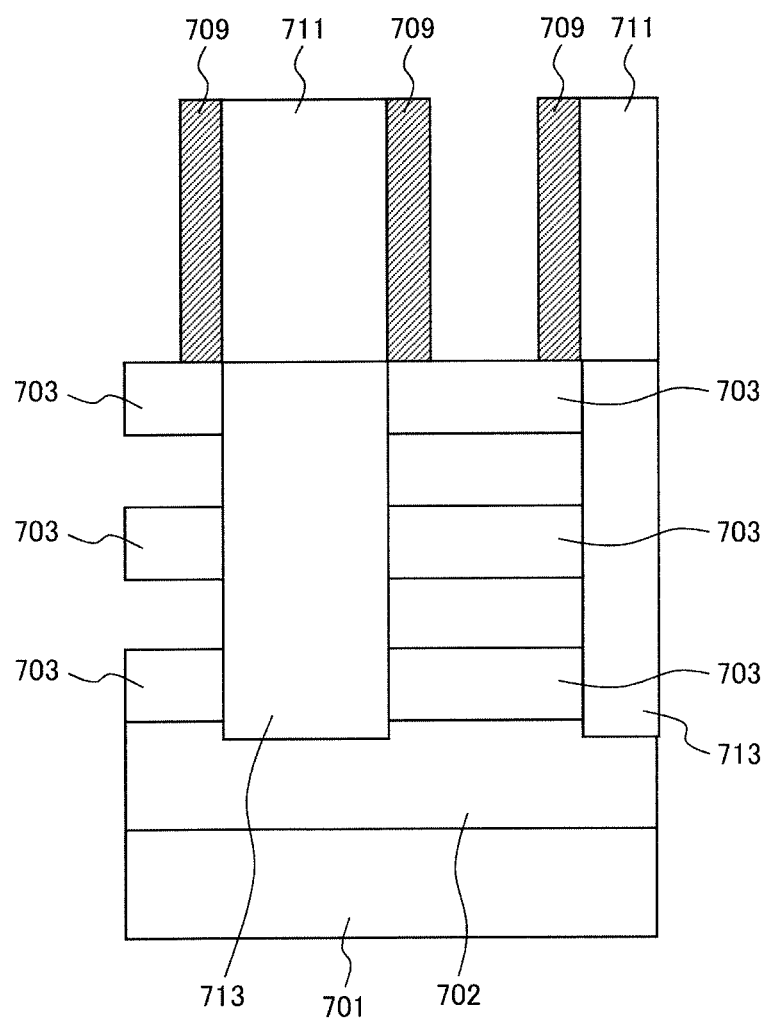
FIG. 15C is a cross-sectional view showing a manufacturing process of the n type MOSFET according to Embodiment 4.

The SiGe layers 704 are selectively etched and removed from the fin structure in the n type MOSFET region shown in FIG. 13D and FIG. 15B in distinction from the Si layers 703 and other layers, so that a structure shown in FIG. 13E and FIG. 15C is obtained. The selective etching for the SiGe layers 704 can be carried out, for example, by the execution of wet etching in which an acid compound liquid of acetic acid ($CH_3COOH$), hydrogen peroxide solution ($H_2O_2$), hydrofluoric acid (HF), and the like is used, or by the execution of dry etching in which halide such as chlorine monofluoride (ClF), iodine monobromide (IBr), chlorine trifluoride (ClF$_3$), or bromine trifluoride (BrF$_3$) is used. The Si layers 703 are processed into channels in a nanowire shape or in a nanosheet shape through this etching.

Figure 13F:
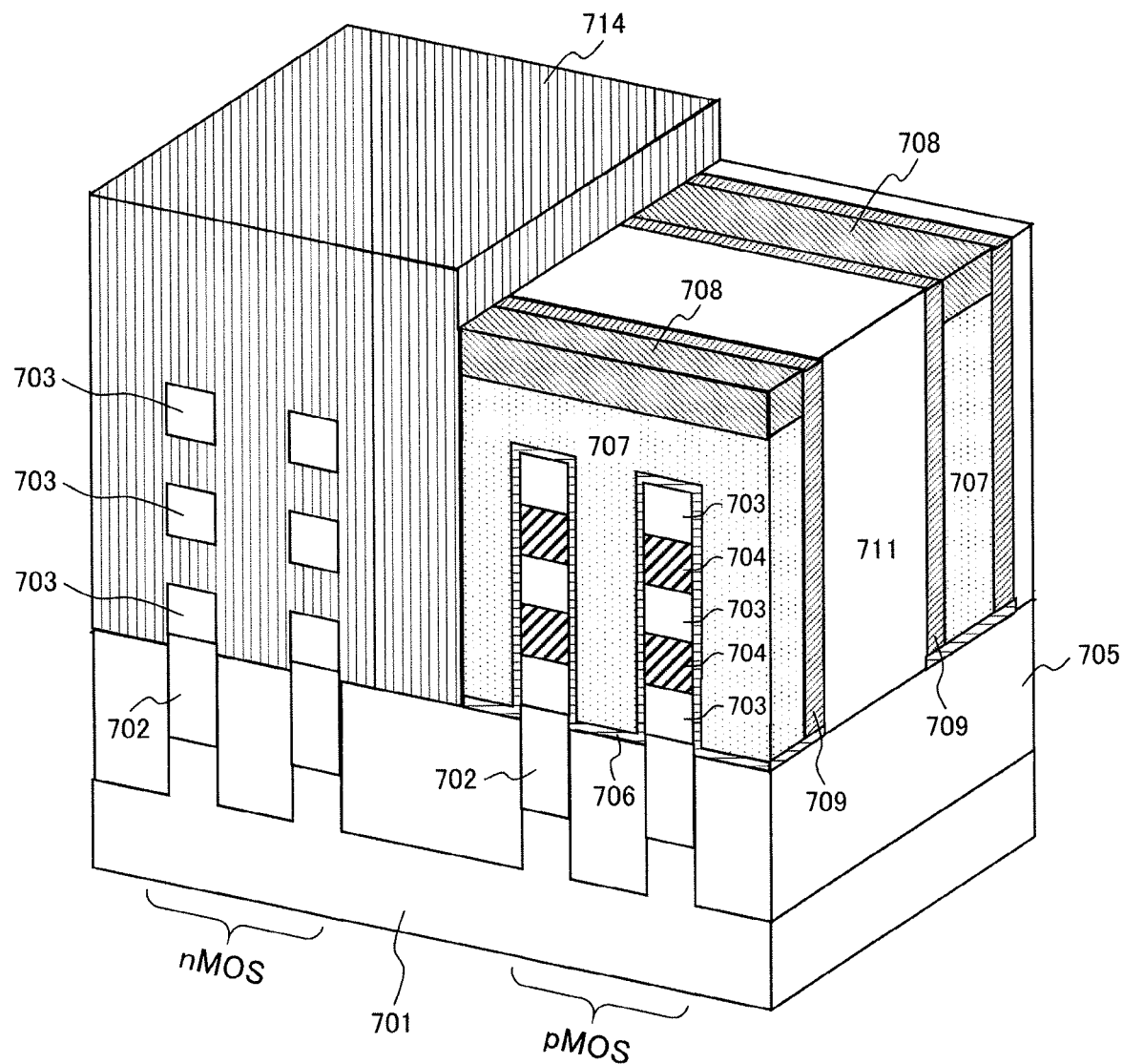
FIG. 13F is a bird's-eye view of a manufacturing process of the semiconductor device including the SiGe channel according to Embodiment 4.
Figure 16A:
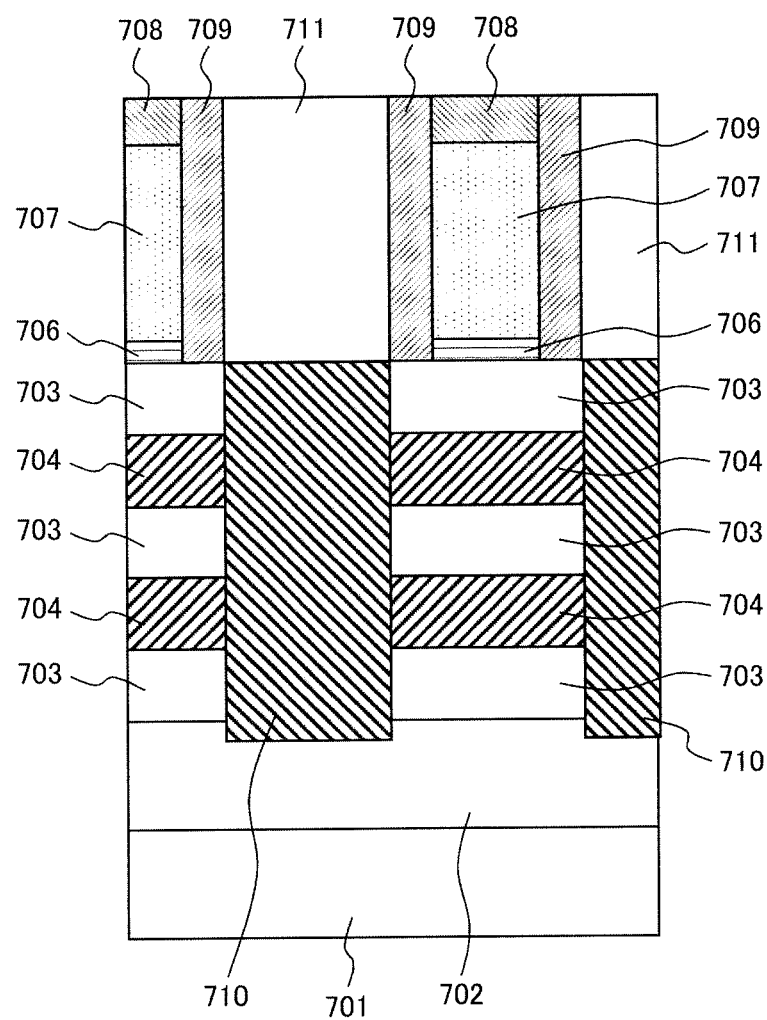
FIG. 16A is a cross-sectional view showing a manufacturing process of a p type MOSFET according to Embodiment 4.

Next, after the resist 712 is removed, the n type MOSFET region is covered with a resist 714, so that a structure shown in FIG. 13F is obtained. Here, the resist 714 can be a trilaminar resist composed of a spin-on-carbon film, a spin-on-glass film, and an organic resist. Here, the spin-on-carbon film is an organic film made of mainly carbon, and the spin-on-glass film is an organic film including Si and oxygen. Usually, in the process using the trilaminar resist, there are many cases where, after the spin-on-glass film is etched using the resist and the spin-on-carbon film is etched using the spin-on-glass film as a mask, the resist and the spin-on-glass film are removed and the spin-on-carbon film is used as a mask, with the result that the resist 714 mainly includes the spin-on-carbon film. FIG. 16A shows a cross-sectional view of the structure shown in FIG. 13F along the line b-b' of FIG. 14, where the cross-sectional view is perpendicular to the gate of the p type MOSFET. In FIG. 16A, the sidewall of a laminated film composed of the Si layers 703 and the SiGe layers 704 on the cross-sectional view perpendicular to the gate is covered with the p type SiGe source/drain 710.

Figure 13G:
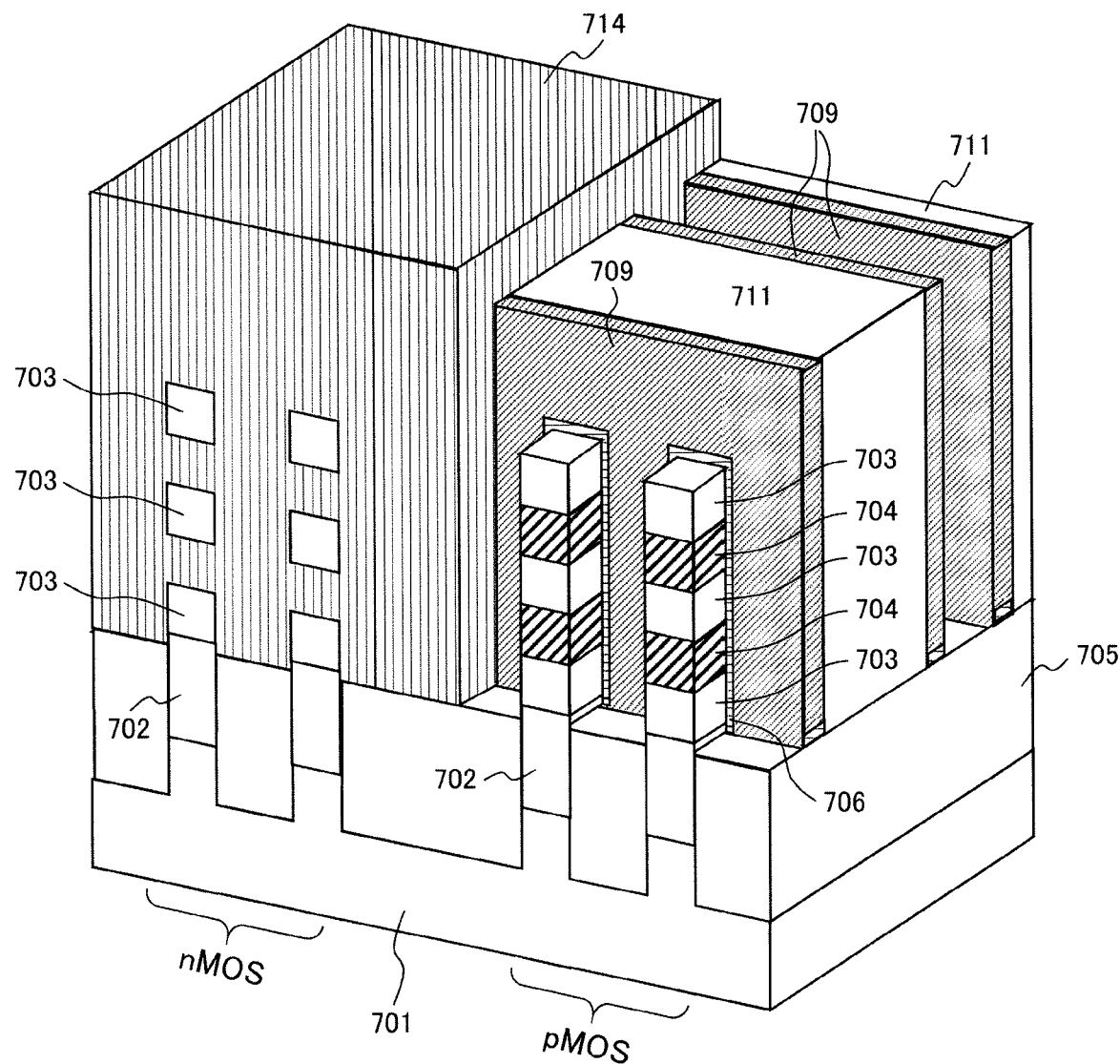
FIG. 13G is a bird's-eye view of a manufacturing process of the semiconductor device including the SiGe channel according to Embodiment 4.
Figure 16B:
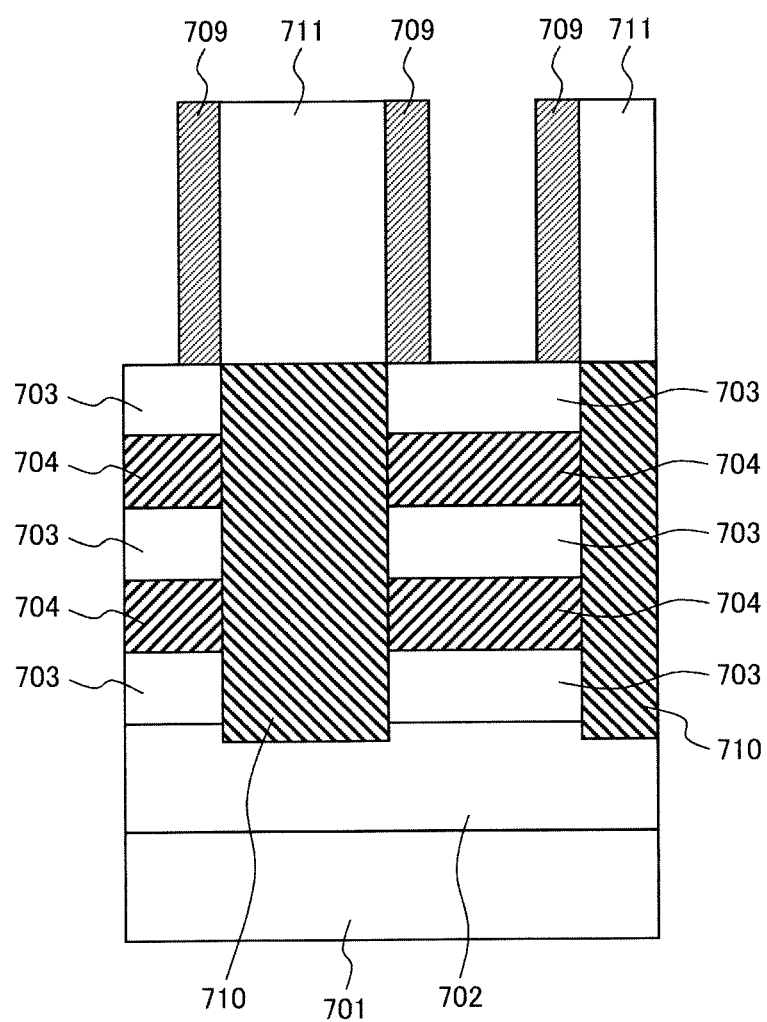
FIG. 16B is a cross-sectional view showing a manufacturing process of the p type MOSFET according to Embodiment 4.

Next, etching is carried out using the resist 714 as a mask, and the hard masks 708 on the dummy gates, the dummy gates 707, and the dummy gate insulating films 706 are sequentially removed by etching, so that a structure shown in FIG. 13G is obtained. In the wake of this etching, the fin structure made of the laminated films composed of the Si layers 703 and the SiGe layers 704 is exposed in the gate formation region of the p type MOSFET. FIG. 16B shows a cross-sectional view of the structure shown in FIG. 13G along the line b-b' of FIG. 14, where the cross-sectional view is perpendicular to the gate of the p type MOSFET.

Figure 13H:
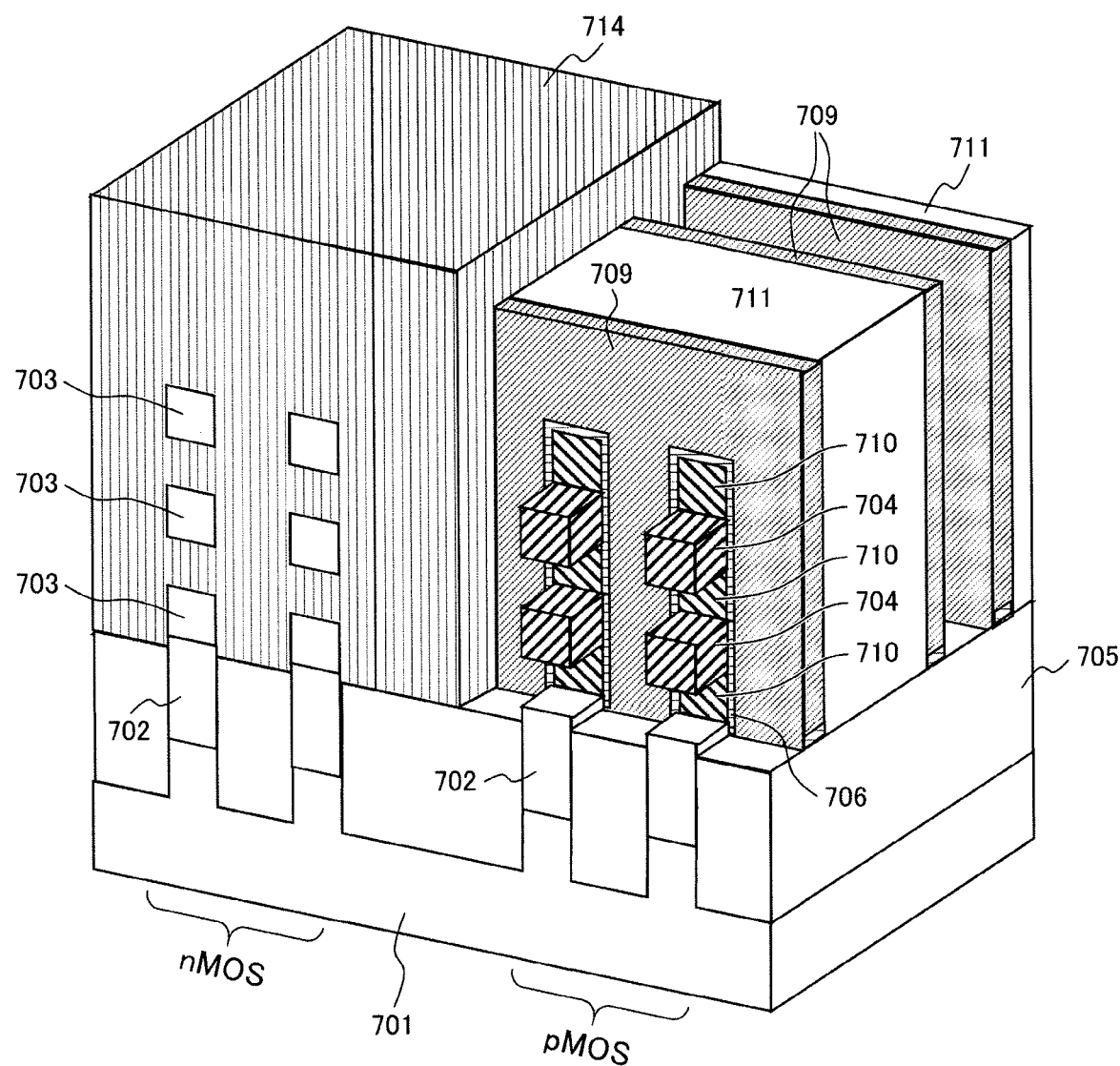
FIG. 13H is a bird's-eye view of a manufacturing process of the semiconductor device including the SiGe channel according to Embodiment 4.
Figure 16C:
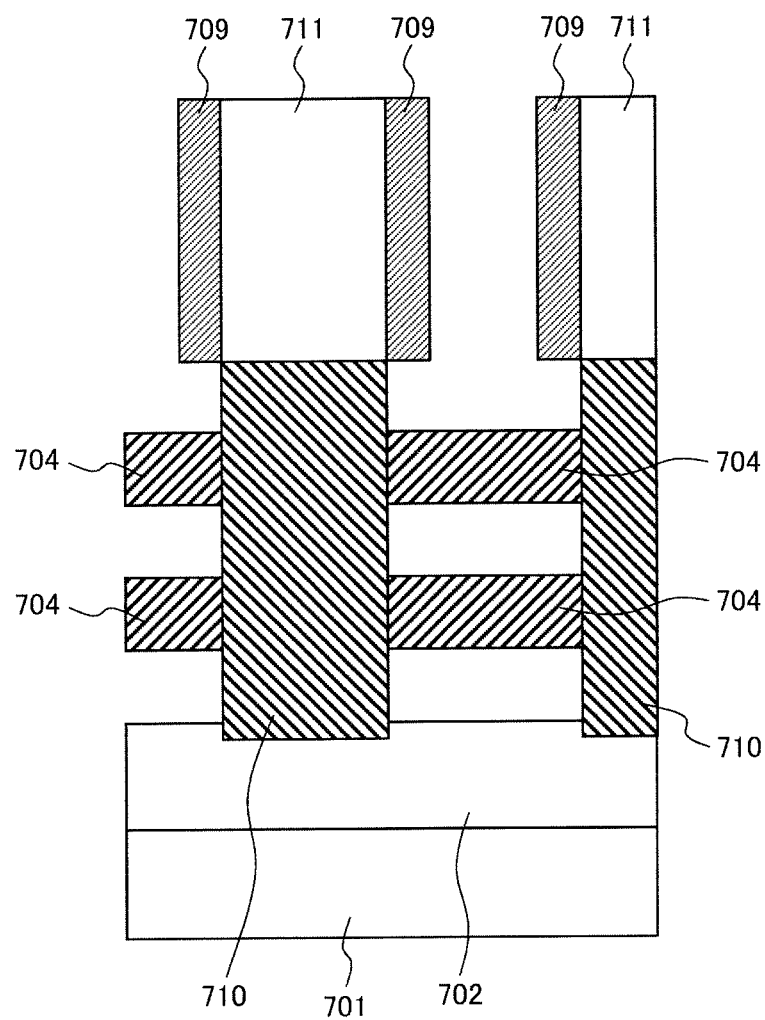
FIG. 16C is a cross-sectional view showing a manufacturing process of the p type MOSFET according to Embodiment 4.

The Si layers 703 are selectively etched and removed from the fin structure in the p type MOSFET region shown in FIG. 13G and FIG. 16B in distinction from the SiGe layers 704 and other layers, so that a structure shown in FIG. 13H and FIG. 16C is obtained. Following the etching removal of the dummy gates 707 and the like, this etching is executed in series in the same chamber. The SiGe layers 704 are processed into channels in a nanowire shape or in a nanosheet shape through this etching. In this state, the surfaces of the SiGe layers 704 and the p type SiGe source/drain 710 surrounded by the gate sidewall insulating films 709 are exposed.

Figure 13I:
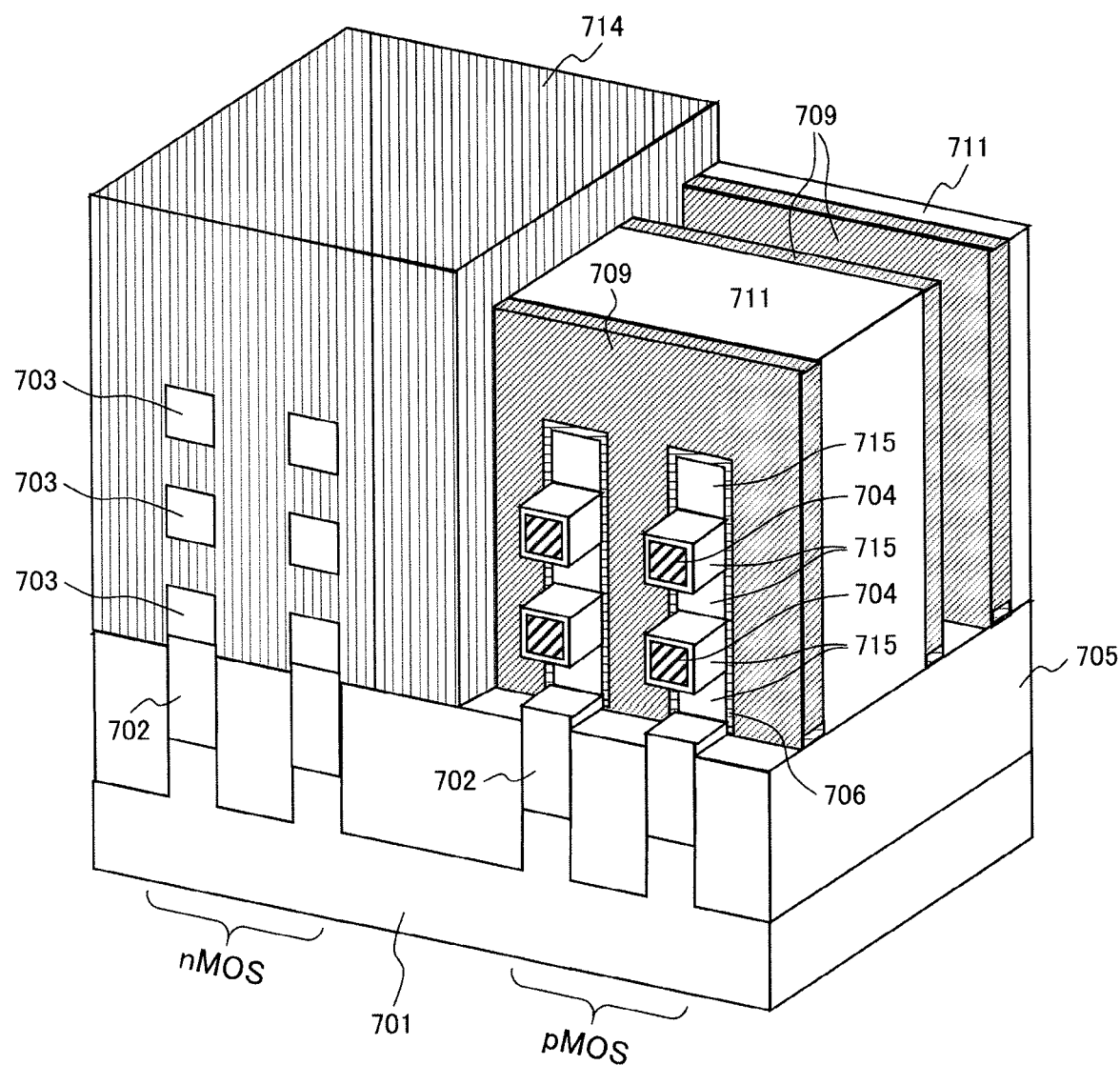
FIG. 13I is a bird's-eye view of a manufacturing process of the semiconductor device including the SiGe channel according to Embodiment 4.
Figure 16D:
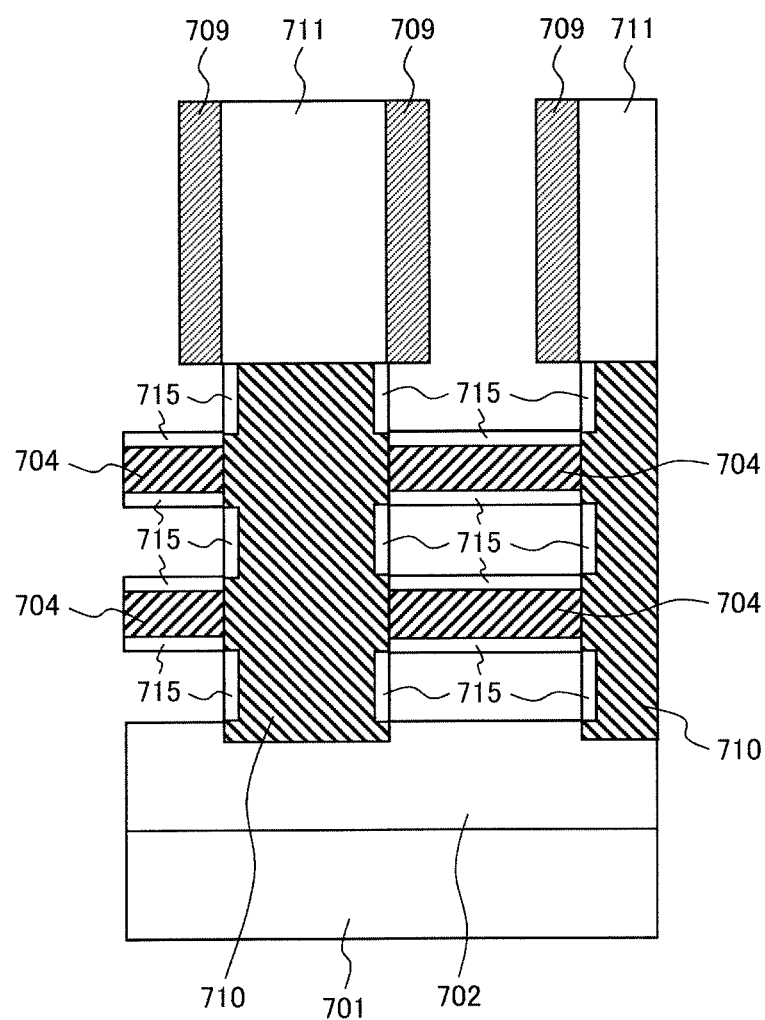
FIG. 16D is a cross-sectional view showing a manufacturing process of the p type MOSFET according to Embodiment 4.

After the selective etching of the Si layers 703, H$_2$ plasma processing is executed in series in the same chamber to induce a Si segregation phenomenon, and an ultrathin film Si segregation layer 715 is formed on the surface of the exposed SiGe channel 704 and the surface of the p type SiGe source/drain 710, so that a structure shown in FIG. 13I and FIG. 16D is obtained.

Figure 18:
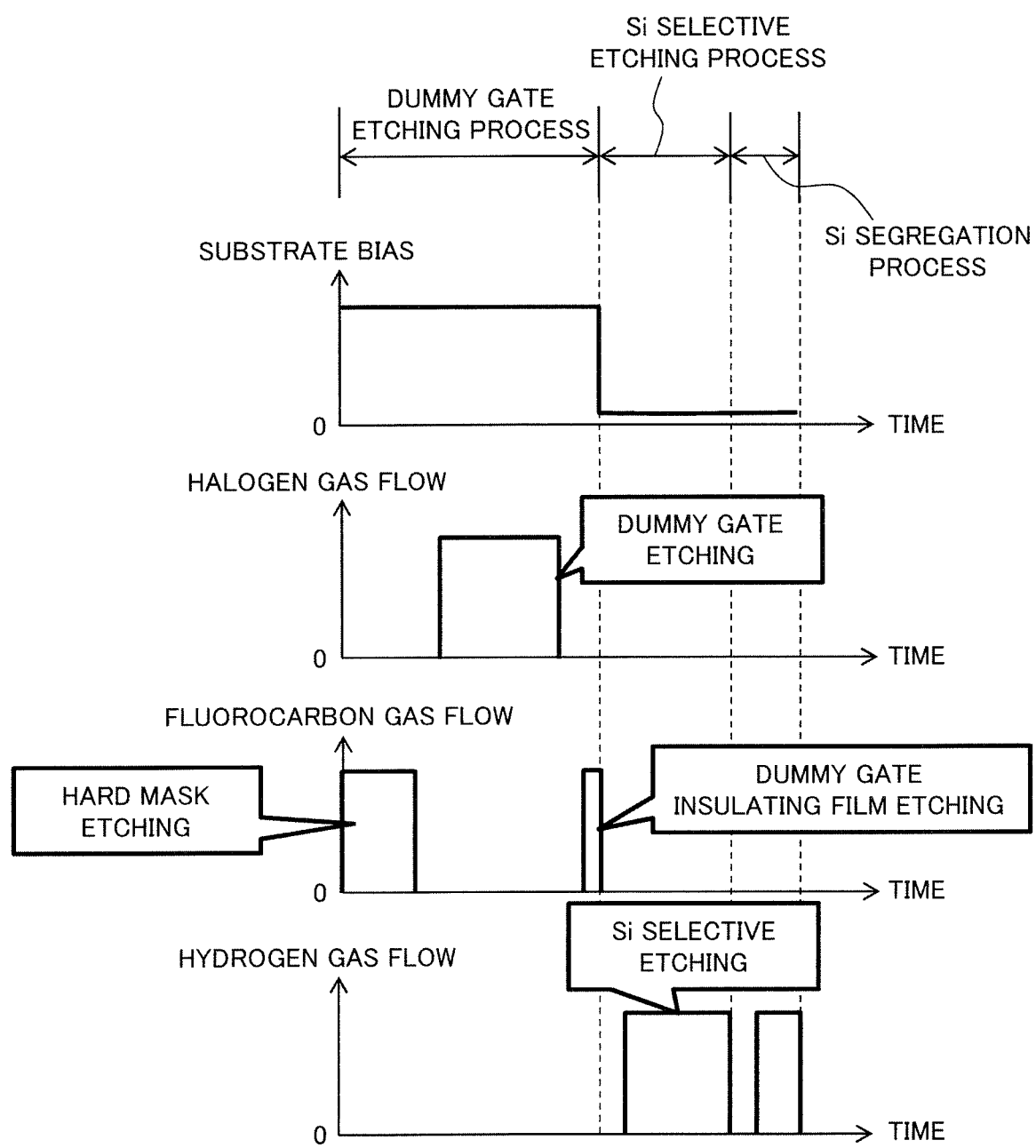
FIG. 18 is a diagram showing the processing conditions of a plasma processing apparatus according to Embodiment 4.

The dummy gate removing process shown in FIG. 13G to the Si segregation process using the H$_2$ plasma process shown in FIG. 13I are carried out in the same chamber in a consistent way, so that the reduction of the number of steps and the improvement of the characteristics of the interface between the channel and the gate can be realized at the same time. FIG. 18 shows the processing conditions of a plasma processing apparatus in these consistent processes.

In the etching of the hard masks 708 on the dummy gates, etching gas is selected in accordance with the material of the hard masks and neighboring materials. In other words, in the case where Si$_3$N$_4$ is used as the material of the hard masks 708, etching having a high selection ratio of the hard masks 708 to other materials can be executed by using mixed gas of fluorocarbon-based gas such as CF$_4$ and oxygen to which Cl$_2$ or the like is added. In the case of the etching of the dummy gates 707, selective etching for selecting amorphous Si or polycrystalline Si, in which the base dummy gate insulating film 706 is used as a stopper, becomes executable by using halogen-based gas such as Cl$_2$ or HBr. In the etching of the dummy gate insulating film 706 to be successively executed, fluorocarbon-based gas such as CF$_4$ or CHF$_3$ is used. Since a certain level of perpendicularity is required for the sequential etchings of the hard masks 708, the dummy gates 707, and the dummy gate insulating films 706, a necessary high frequency bias is applied to the substrate. Next, in the selective etching of the Si layers 703, since isotropic etching is required, the magnitude of the high frequency bias applied to the substrate is set lower than in the case of executing the etching of the dummy gates 707 and the like, or no high frequency bias is applied to the substrate. It is preferable that source gas used for plasma for the selective etching should be H$_2$ gas to which for example, sulfur hexafluoride (SF$_6$) or fluorocarbon-based gas is added. In the next H$_2$ plasma processing for inducing Si segregation, H$_2$ gas is mainly used, and as is the case with the selective etching of the Si layers 703, the magnitude of the high frequency bias applied to the substrate is set lower than in the case of executing the etching of the dummy gates 707 and the like, or no high frequency bias is applied to the substrate.

Figure 13J:
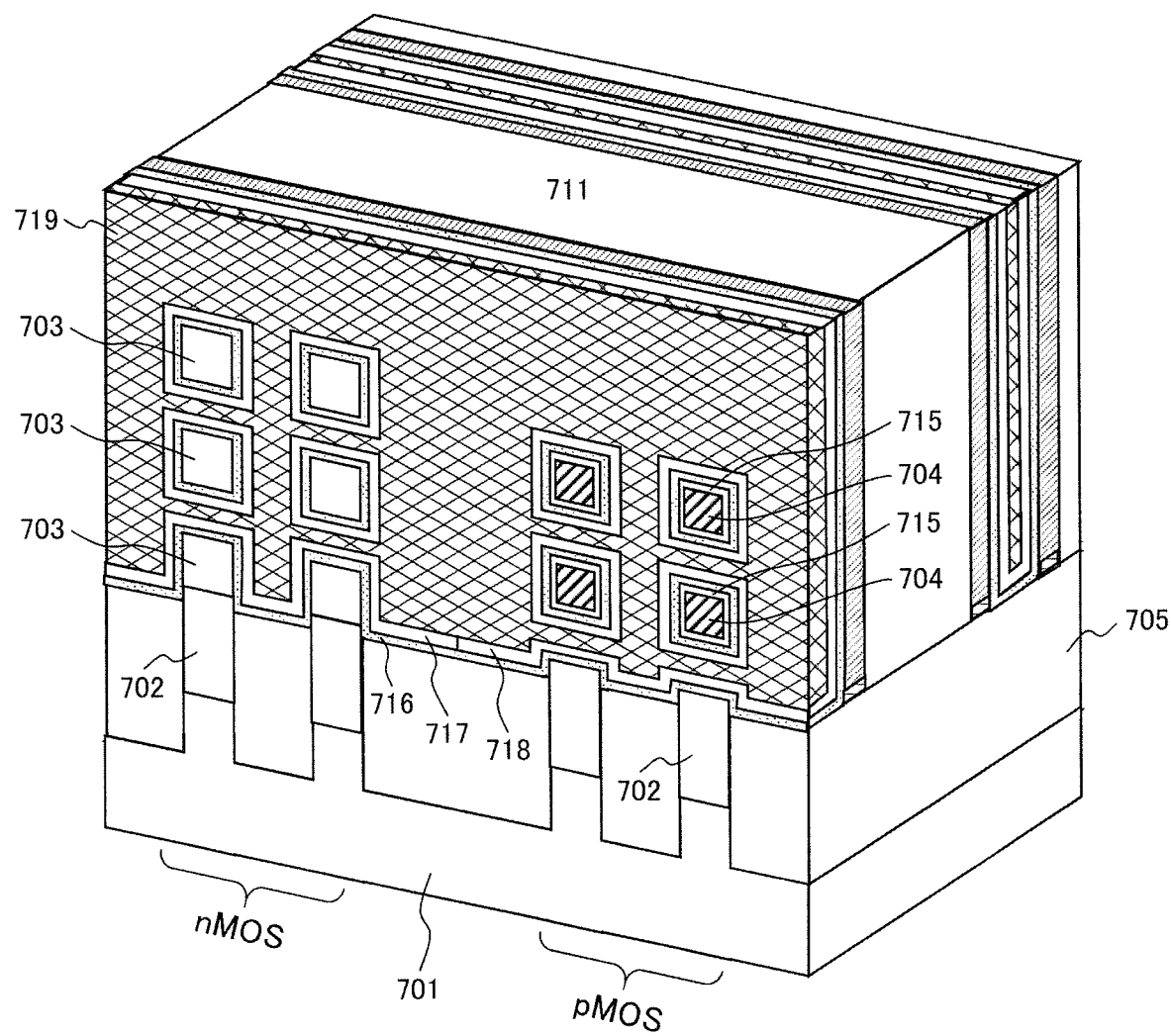
FIG. 13J is a bird's-eye view of a manufacturing process of the semiconductor device including the SiGe channel according to Embodiment 4.
Figure 16E:
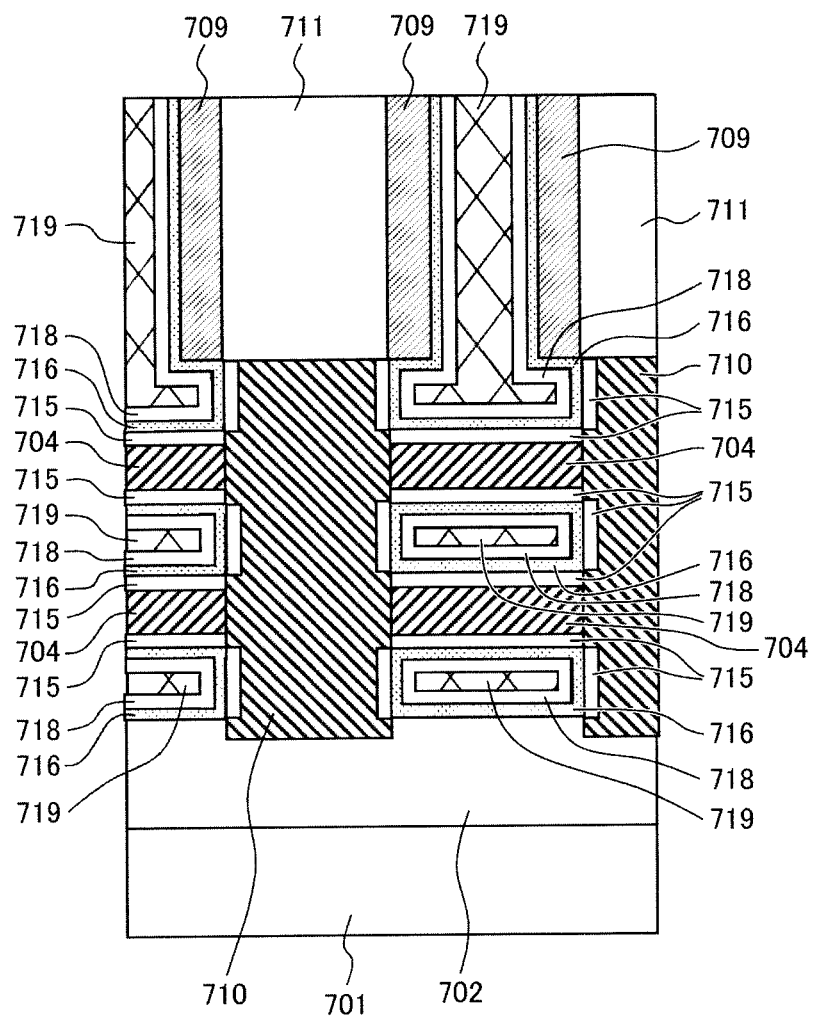
FIG. 16E is a cross-sectional view showing a manufacturing process of the p type MOSFET according to Embodiment 4.

Gate insulating films 716, n type WFMs 717 or p type WFMs 718 are deposited on the structure shown in FIG. 13I and FIG. 16D, and after gate metals 719 are further deposited, the surface is flattened by carrying out CMP, with the result that a structure shown in FIG. 13J and FIG. 16E are obtained. The n type WFMs 717 and the p type WFMs 718 are separately formed in the n type MOSFET region and the p type MOSFET region respectively. The formation method of this gate film stack is the same as that shown in Embodiment 1.

Figure 17:
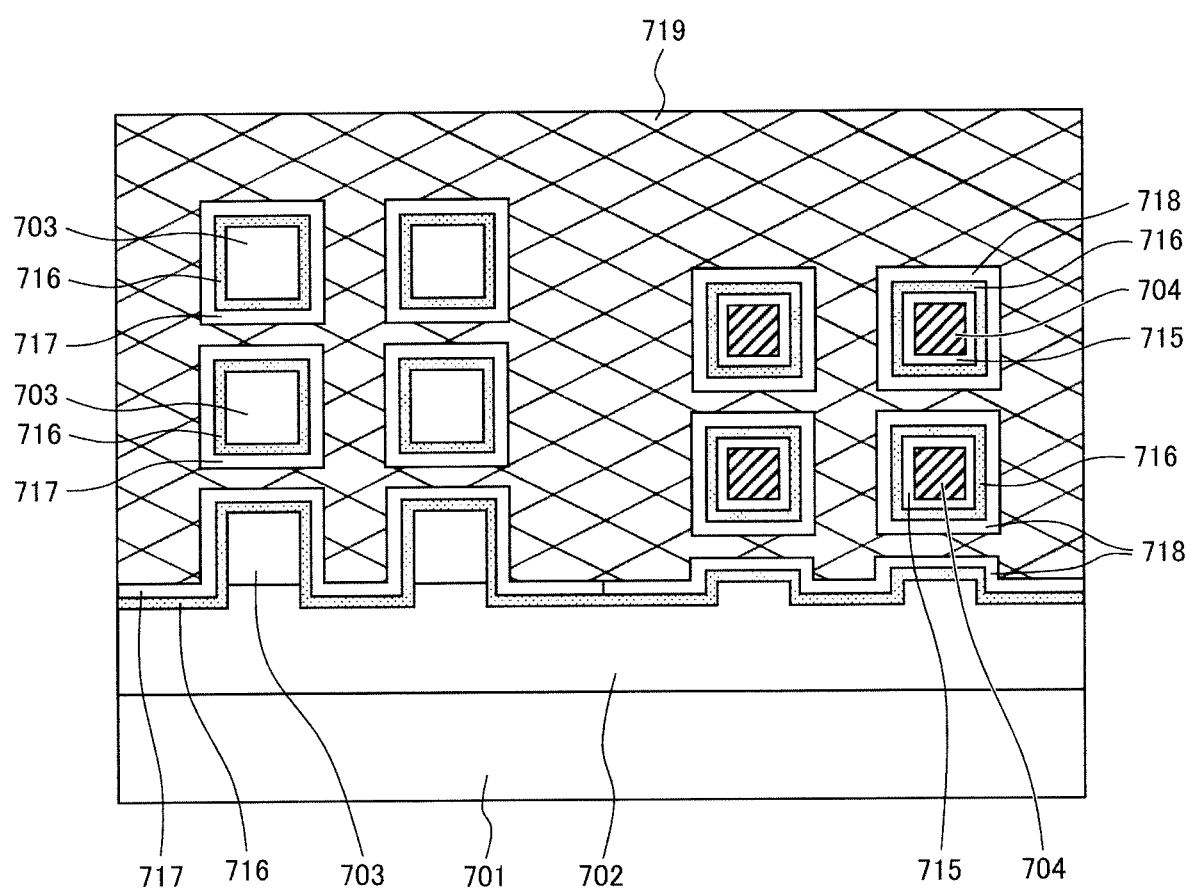
FIG. 17 is a cross-sectional view of the semiconductor device including the SiGe channel according to Embodiment 4.

FIG. 17 shows a cross-sectional view of the structure of the MOSFET of Embodiment 4 along the line c-c' of FIG. 14. The MOSFET of Embodiment 4 has a gate all around structure in which the periphery of the Si nanowire (or nanosheet) channel 703 and the periphery of the SiGe nanowire (or nanosheet) channel 704 are covered with gates, which makes it possible to fabricate a MOSFET having better gate controllability than the gate controllability of a MOSFET having a FinFET structure. Furthermore, in the gate all around type MOSFET, the surfaces of the SiGe channels 704 are protected by the ultrathin film Si segregation layer 715. As a result, both increase of an off-current and degradation of an on-current owing to the state of the channel/gate insulating film interface can be suppressed, and a semiconductor device that can realize both high on-current and low off-current can be fabricated.

DESCRIPTIONS OF THE REFERENCE NUMERALS AND SYMBOLS 1, 501, 601, 701 . . . Si substrate (monocrystal Si layer), 2, 502, 602 . . . monocrystal strain SiGe layer, 3, 503 . . . hard mask, 4, 505, 607, 715 . . . Si segregation layer, 5, 504, 603, 705 . . . element isolation (STI) insulating film, 6, 604, 706 . . . dummy gate insulating film, 7, 605, 707 . . . dummy gate, 8, 606, 708 . . . hard mask, 9, 709 . . . gate sidewall insulating film, 10 . . . hard mask, 11, 710 . . . p type SiGe source/drain, 12, 711 . . . inter-layer insulating film, 13, 506, 716 . . . gate insulating film, 14, 507, 717 . . . n type work function metal, 15, 508, 718 . . . p type work function metal, 16, 509, 719 . . . gate metal, 70 . . . hole, 90 . . . redeposition object layer, 702 . . . strain-relaxed monocrystal SiGe layer or strain-relaxed monocrystal Si layer, 703 . . . monocrystal strain Si or monocrystal strain SiGe layer, 704 . . . monocrystal strain SiGe layer, 712 . . . resist, 713 . . . n type Si source/drain, 714 . . . resist, 401 . . . processing chamber (chamber), 402 . . . vacuum exhaust opening, 403 . . . shower plate, 404 . . . window unit, 405 . . . gas source, 406 . . . gas supply device, 407 . . . gas introduction opening, 408 . . . high frequency power source for generating plasma, 409 . . . waveguide, 410 . . . magnetic field generating coil, 411 . . . semiconductor substrate, 412 . . . sample support, 413 . . . high frequency bias power source, 420 . . . control unit

The invention claimed is:

1. A manufacturing method of a semiconductor device comprising:
    a first step for performing plasma processing on a semiconductor substrate including at least a silicon layer and a silicon germanium layer formed on the silicon layer under a first condition to expose the silicon germanium layer; and
    a second step for performing plasma processing on the semiconductor substrate to segregate silicon on the surface of the exposed silicon germanium layer under a second condition,
    wherein the first condition is a condition under which the silicon germanium layer or layers lying adjacent to the silicon germanium layer can be etched,
    the second condition is a condition under which hydrogen plasma processing is performed, and
    the first step and the second step are executed in series in the same processing chamber of a plasma processing apparatus.

2. The manufacturing method of a semiconductor device according to claim 1,
    wherein the first step and the second step are executed at room temperature.

3. The manufacturing method of a semiconductor device according to claim 1,
    wherein the second condition is a condition, under which a high frequency bias the frequency of which is lower than the frequency of a high frequency bias applied to the semiconductor substrate under the first condition, is applied to the semiconductor substrate, or a condition under which no high frequency bias is applied to the semiconductor substrate.

4. The manufacturing method of a semiconductor device according to claim 1, wherein a processing time during which hydrogen plasma processing is performed on the semiconductor substrate is equal to or less than 20 seconds.

5. The manufacturing method of a semiconductor device according to claim 3,
    wherein the thickness of the silicon segregation layer formed at the second step is less than 1 nm.

6. The manufacturing method of a semiconductor device according to claim 1,
    wherein the semiconductor device is a fin type FET,
    the first step is a step in which the fin structure of the fin type FET is formed, and
    the first condition is a condition under which anisotropic etching is executed on the silicon germanium layer and the silicon layer while the direction of the etching is kept perpendicular to the semiconductor substrate.

7. The manufacturing method of a semiconductor device according to claim 6,
    wherein the second step is a step in which the hydrogen plasma processing is performed on the semiconductor substrate while a hard mask used for forming the fin structure at the first step as a mask is left as it is on the fin structure.

8. The manufacturing method of a semiconductor device according to claim 1,
    wherein the semiconductor device is a fin type FET,
    the first step is a step in which a device isolation region is formed by etching back a first insulating film deposited so as to cover the fin structure of the fin type FET, and
    the first condition is a condition under which the first insulating film is selectively etched in distinction from the silicon germanium layer and the silicon layer.

9. The manufacturing method of a semiconductor device according to claim 1,
    wherein the semiconductor device is a fin type FET,
    the first step is a step in which a second insulating film formed on the fin structure of the fin type FET and a noncrystalline silicon layer or a polycrystalline silicon layer formed on the second insulating film are removed by etching, and
    the first condition is a condition under which the second insulating film and the noncrystalline silicon layer or the polycrystalline silicon layer are selectively etched in distinction from the silicon germanium layer and the silicon layer.

10. The manufacturing method of a semiconductor device according to claim 9,
    wherein the second insulating film is a dummy gate insulating film, and the noncrystalline silicon layer or the polycrystalline silicon layer is a dummy gate layer.

11. The manufacturing method of a semiconductor device according to claim 1,
    wherein the semiconductor device is a fin type FET, and the second step is repeated plural times in the manufacturing process of the fin type FET.

12. The manufacturing method of a semiconductor device according to claim 1,
    wherein the semiconductor device is a gate all around type FET the whole peripheral of the channel of which is covered with a gate,
    a fin structure is formed in a laminated film composed of the silicon layer and the silicon germanium layer that are formed on the semiconductor substrate before the first step,
    the first step is a step in which the silicon layer is removed from the fin structure by etching, and
    the first condition is a condition under which the silicon layer of a fin structure is selectively etched in distinction from the silicon germanium layer of a fin structure.

* * * * *